United States Patent
Teodorescu et al.

(10) Patent No.: US 9,382,898 B2
(45) Date of Patent: Jul. 5, 2016

(54) WIND TURBINE POWER PRODUCTION USING POSITIVE AND NEGATIVE SEQUENCE CURRENT COMPONENT PARAMETERS GENERATED BASED ON OPERATIONAL MODE

(75) Inventors: Remus Teodorescu, Aalborg (DK); Pedro Rodriguez, Terrassa-Barcelona (ES); Alvaro Luna Alloza, Terrassa-Barcelona (ES); Amit Kumar Gupta, Singapore (SG)

(73) Assignee: Vestas Wind Systems A/S, Aarhus N. (DK)

( * ) Notice: Subject to any disclaimer, the term of this patent is extended or adjusted under 35 U.S.C. 154(b) by 374 days.

(21) Appl. No.: 13/884,796
(22) PCT Filed: Nov. 8, 2011
(86) PCT No.: PCT/DK2011/050421
§ 371 (c)(1),
(2), (4) Date: Oct. 4, 2013
(87) PCT Pub. No.: WO2012/062323
PCT Pub. Date: May 18, 2012

(65) Prior Publication Data
US 2014/0015250 A1 Jan. 16, 2014

Related U.S. Application Data

(60) Provisional application No. 61/411,938, filed on Nov. 10, 2010.

(30) Foreign Application Priority Data

Nov. 10, 2010 (DK) ................................. 2010 70479

(51) Int. Cl.
H02P 9/04 (2006.01)
F03D 7/00 (2006.01)
(Continued)

(52) U.S. Cl.
CPC ................ *F03D 7/00* (2013.01); *F03D 7/0284* (2013.01); *F03D 7/042* (2013.01); *F03D 9/003* (2013.01);
(Continued)

(58) Field of Classification Search
CPC ......... F03D 7/00; F03D 7/0284; F03D 7/042;
F03D 9/003; F05B 2270/337; H02J 2003/001;
H02J 3/26; H02J 3/386; H02P 9/04; Y02E
10/723; Y02E 10/725; Y02E 10/763; Y02E
40/50
See application file for complete search history.

(56) References Cited

U.S. PATENT DOCUMENTS

2003/0151259 A1 8/2003 Feddersen et al.
2008/0106099 A1 5/2008 Ichinose et al.
(Continued)

FOREIGN PATENT DOCUMENTS

EP 0153614 A2 9/1985
EP 2017936 A1 1/2009
(Continued)

OTHER PUBLICATIONS

Search Report in priority application PA201070479, issued by Danish Patent and Trademark Office, Jun. 16, 2011.
(Continued)

*Primary Examiner* — Pedro J Cuevas
*Assistant Examiner* — S. Mikailoff
(74) *Attorney, Agent, or Firm* — Patterson + Sheridan, LLP

(57) ABSTRACT

A wind turbine includes a grid side converter coupled to a grid via a power line. The method includes determining a first active power reference and a first reactive power reference indicating a requested amount of active power and reactive power, respectively, depending on at least a wind turbine operation strategy; determining a positive and negative sequence components of a grid voltage; determining indications of an actual amount of active power and reactive power to be supplied by the grid side converter to the grid, respectively; generating a parameters defining a proportion of positive sequence current component and negative sequence current component to be injected by the grid side converter in order to supply active power and reactive power; and supplying, with the grid side converter, active and reactive power to the power line based on the current reference.

26 Claims, 17 Drawing Sheets

(51) Int. Cl.
| | |
|---|---|
| *F03D 7/02* | (2006.01) |
| *F03D 7/04* | (2006.01) |
| *H02J 3/26* | (2006.01) |
| *H02J 3/38* | (2006.01) |
| *F03D 9/00* | (2016.01) |
| *H02J 3/00* | (2006.01) |

(52) U.S. Cl.
CPC . *H02J 3/26* (2013.01); *H02J 3/386* (2013.01); *H02P 9/04* (2013.01); *F05B 2270/337* (2013.01); *H02J 2003/001* (2013.01); *Y02E 10/723* (2013.01); *Y02E 10/725* (2013.01); *Y02E 10/763* (2013.01); *Y02E 40/50* (2013.01)

(56) References Cited

U.S. PATENT DOCUMENTS

| | | | | |
|---|---|---|---|---|
| 2009/0021013 | A1* | 1/2009 | Andresen | 290/44 |
| 2010/0292852 | A1* | 11/2010 | Gertmar et al. | 700/287 |
| 2012/0203385 | A1* | 8/2012 | Kumar | 700/287 |
| 2013/0241201 | A1* | 9/2013 | Fortmann | 290/44 |
| 2013/0264824 | A1* | 10/2013 | Gupta et al. | 290/44 |
| 2013/0265809 | A1* | 10/2013 | Gupta et al. | 363/131 |
| 2013/0286697 | A1* | 10/2013 | Eiland et al. | 363/71 |
| 2014/0138949 | A1* | 5/2014 | El Moursi et al. | 290/44 |
| 2014/0339830 | A1* | 11/2014 | Gupta et al. | 290/44 |

FOREIGN PATENT DOCUMENTS

| | | |
|---|---|---|
| GB | 2451463 A | 2/2009 |
| WO | 01/73518 A1 | 10/2001 |
| WO | 2008/137836 A1 | 11/2008 |

OTHER PUBLICATIONS

Wang Y; Xu L; Williams B W: "Compensation of network voltage unbalance using doubly fed induction generator-based wind farms", IET Renewable Power Generation, vol. 3, No. 1, Journal Article, Mar. 9, 2009. The whole document.

Pedro Rodriguez; Gustavo Medeiros; Alvaro Luna; Marcelo C Cavalcanti; Remus Teodorescu: "Safe current injection strategies for a STATCOM under asymmetrical grid faults", Energy Conversion Congress and Exposition (ECCE), 2010 IEEE, ISBN 978-1-4244-5286-6; ISBN 1-4244-5286-4, Conference Proceedings Article, Sep. 12, 2010. The whole document.

Examination Report in priority application PA201070479, issued by Danish Patent and Trademark Office, Jun. 23, 2011.

International Search Report and Written Opinion, PCT/DK2011/050421, Jul. 2, 2012.

\* cited by examiner

1200

| Phase | $\gamma$ | Coefficients |
|---|---|---|
| $\hat{I}_a$ | $\gamma = \dfrac{|\phi^+| - |\phi^-|}{2} + 0$ | $\hat{I}_\alpha{}' = \sqrt{A_1^2 + B_1^2}$ |
| $\hat{I}_b$ | $\gamma = \dfrac{|\phi^+| - |\phi^-|}{2} + \pi/3$ | $A_1 = I_{pL} \cdot \cos\gamma - I_{qL} \cdot \sin\gamma$ |
| $\hat{I}_c$ | $\gamma = \dfrac{|\phi^+| - |\phi^-|}{2} - \pi/3$ | $B_1 = -I_{qS} \cdot \cos\gamma - I_{pS} \cdot \sin\gamma$ |

Figure 12

WIND TURBINE POWER PRODUCTION USING POSITIVE AND NEGATIVE SEQUENCE CURRENT COMPONENT PARAMETERS GENERATED BASED ON OPERATIONAL MODE

TECHNICAL FIELD

The present invention relates generally to a method for operating a wind turbine and a system for operating a wind turbine.

BACKGROUND

In the recent years, demand for green energy has increased. Wind turbines, which convert wind energy into electrical energy, are a means for green energy. As such, reliance on wind energy has also increased over the recent years. Due to this increased penetration of wind energy, grid codes regulating connections with power grids have become stricter over the time.

Existing and upcoming grid codes state fault ride through requirements which require the wind turbines to stay connected with the grid for a certain period of tinge to support the grid through reactive power exchange during occurrences of grid faults. Most grid faults are asymmetrical in nature. Thus, it is desirable that the wind turbines can remain operating without tripping under an asymmetrical fault condition.

SUMMARY

According to one embodiment of the present invention, a method for operating a wind turbine comprising a grid side converter is provided. The grid side converter is coupled to a grid via a power line. The method includes determining a wind turbine operation strategy; determining a first active power reference and a first reactive power reference indicating a requested amount of active power and reactive power, respectively, depending on at least the wind turbine operation strategy; measuring a grid voltage; determining a positive sequence component and a negative sequence component of the grid voltage, i.e. a positive sequence voltage and a negative sequence voltage; determining a second active power reference and a second reactive power reference indicating an actual amount of active power and reactive power to be supplied by the grid side converter to the grid, respectively, depending on at least the first active power reference, the first reactive power reference, and the wind turbine operation strategy; generating, based on at least the wind turbine operation strategy, a first parameter and a second parameter which define a proportion of positive sequence current component and negative sequence current component to be injected by the grid side converter in order to supply active power and reactive power in accordance with the second active power reference and the second reactive power reference; generating a current reference based on at least the second active power reference, the second reactive power reference, the positive sequence voltage, the negative sequence voltage, the first parameter, and the second parameter; and supplying, with the grid side converter, active and reactive power to the power line based on the current reference.

Such a method enables the wind turbine to stay connected to the grid and support the grid during occurrences of asymmetrical grid faults. Besides asymmetrical grid faults, the method handles symmetrical grid faults as well. In this case, a slight modification in the control strategy related to negative sequence voltages may be needed especially when the magnitude of negative sequence voltages is very small. However, the basic controlling mechanism is fundamentally the same for asymmetrical grid faults and symmetrical grid faults. It should be noted that for symmetrical grid fault handling, the first parameter and the second parameter will respectively be substantially close to 1.

There are several possibilities to determine the grid voltage. One possibility is to measure a phase-ground voltage. Other approaches are possible.

According to one embodiment of the present invention, the first parameter indicates the proportion of positive sequence current component and negative sequence current component for the amount of active power to be supplied by the grid side converter.

According to one embodiment of the present invention, the second parameter indicates the proportion of positive sequence current component and negative sequence current component for the amount of reactive power to be supplied by the grid side converter.

Generally, according to an embodiment of the present invention, the setting of the first parameter and the second parameter is done in dependence on the kind of fault (asymmetrical or symmetrical) which has to be handled. In order to achieve this, according to an embodiment of the present invention, at any given time or sampling period, the first and second parameter are continuously updated to handle the level and type of fault. This means that individual settings (parameter values) of the first parameter and the second parameter can be chosen for fault handling. In this way, a flexible reaction on grid faults can be achieved to meet the desired performance.

According to one embodiment of the present invention, determining the second active power reference and the second reactive power reference includes determining, based on the wind turbine operation strategy, whether an optimization of the first active power reference and the first reactive power reference has to be carried out; generating the second active power reference and the second reactive power reference such that they differ from the first active power reference and the first reactive power reference, respectively, when it is determined that an optimization has to be carried out; generating the second active power reference and the second reactive power reference such that they are identical to the first active power reference and the first reactive power reference, respectively, when it is determined that no optimization has to be carried out.

The optimization may be necessary/advantageous for any kind of reasons/situations. That is, if it is found that, for any reason, a change of the first active power reference and/or the first reactive power reference may lead to better results than simply using the first active power reference and the first reactive power reference unchanged (i.e. second active power reference and the second reactive power reference are set to be equal to the first active power reference and the first reactive power reference, respectively), then an optimization may be carried out. In the following, some examples of scenarios are given in which an optimization is necessary/advantageous.

According to one embodiment of the present invention, determining whether an optimization of the first active power reference and the first reactive power reference has to be carried out includes determining whether the current reference would cause, when calculated based on the first active power reference and the first reactive power reference, the grid side converter supply power to the grid having a current component which exceeds a grid side converter current limit, wherein, if the current component exceeds the grid side converter current limit the second active power reference and the second reactive power reference are generated such that the resulting current component of the supplied power remains below the grid side converter current limit.

Many approaches are possible to determine the second active power reference and the second reactive power reference. For example, one approach is to set the second reactive power reference to a maximum value and to set the second active power reference to a value as high as possible without exceeding the grid side converter current and voltage limits, or vice versa. A second example may be to generate the second active power reference and the second reactive power reference by decreasing the values of the first active power reference and the first reactive power reference while keeping always the same ratio between them until the grid side converter current limit is fulfilled. Other approaches are possible depending on the priorities to be handled. Generally, the approach chosen depends on the wind turbine operation strategy.

According to one embodiment of the present invention, determining whether the current component would exceed the grid side converter current limit includes the following processes: calculating, for each phase of the power line, a maximum current would result if the current reference was generated, the calculation being carried out based on at least the turbine operation strategy, the first active power reference, the first reactive power reference, the positive sequence voltage, the negative sequence voltage, the first parameter, the second parameter, and a phase angle; comparing the maximum current of each phase with a grid side converter phase current limit; and determining that the current component exceeds the grid side converter current limit when one of the maximum phase currents exceeds the corresponding grid side converter phase current limit.

According to one embodiment of the present invention, in order to determine maximum current for each phase, the following processes are carried out: determining an active current ellipse defined at least by the first parameter, the positive sequence voltage, the negative; sequence voltage, and the first active power reference, and determining a reactive current ellipse defined at least by the second parameter, the positive sequence voltage, the negative sequence voltage, the in-quadrature positive sequence voltage, the in-quadrature negative sequence voltage, and the first reactive power reference, adding the active current ellipse and the reactive current ellipse in order to obtain a combined current ellipse, rotating the combined current ellipse about the phase angle, and determining the maximum projections of the combined current ellipse onto the abc axes corresponding to a three phase system, wherein each projection on abc axes corresponds to a maximum current in the respective abc phases of the three phase sys tem.

According to one embodiment of the present invention, determining whether an optimization of the first active power reference and the first reactive power reference has to be carried out includes: determining whether the second active power reference and the second reactive power reference are to be generated in dependence on priority levels indicating whether regulating the active power or regulating the reactive power to corresponding power reference levels has higher priority, wherein the second active power reference and the second reactive power reference are generated in dependence on the priority levels if the priority levels are to be considered.

According to one embodiment of the present invention, optimization of the first active power reference and the first reactive power reference includes several steps of optimization: for example, in a first step, the first active power reference and the first reactive power reference are optimized with respect to a first parameter. Then, in a second step, the first active power reference and the first reactive power reference are optimized with respect to a second parameter. The optimization of the second parameter may be carried out such that the optimization of the first parameter is maintained during the optimization of the second parameter. For example, if the first step optimizes the first active power reference and the first reactive power reference such that the grid side converter current limit is kept, the second step may optimize the first active power reference and the first reactive power reference such that, while maintaining the grid side converter current limit, the priorities regarding injecting active/reactive power are tailored to a particular grid fault condition or performance. In a third step, the first active power reference and the first reactive power reference may be optimized with respect to a third parameter while maintaining the results of the first step optimization and the second step optimization, etc. The second active power reference and the second reactive power reference are the result of the optimization processes of the first active power reference and the first reactive power reference. In this way, an arbitrary number of parameters may be optimized, each optimization limiting the range of possible values for the second active power reference and the second reactive power reference further.

According to one embodiment of the present invention, the method further includes checking whether the second active power reference falls within a predetermined active power range, or whether the second reactive power reference falls within a predetermined reactive power range, changing the second active power reference or the second reactive power reference to fall within the predetermined power ranges when the second active power reference and/or the second reactive power reference do not fall within the predetermined power ranges.

This embodiment may for example be used to check whether the values of the calculated second active power reference and the second reactive power make sense. For example, if the second active power reference is calculated such that it has a negative value, it may be set to zero since a negative value might not make sense. Thus, this embodiment may be used as a "plausibility check".

According to one embodiment of the present invention, the method further includes replacing the second active power reference by an upper limit value of the predetermined active power range if the second active power reference exceeds the upper limit value, or replacing the second active power reference by a lower limit value of the predetermined active power range if the second active power reference falls below the lower limit value, and replacing the second reactive power reference by an upper limit value of the predetermined reactive power range if the second reactive power reference exceeds the upper limit value, or replacing the second reactive power reference by a lower limit value of the predetermined reactive power range if the second reactive power reference falls below the lower limit value.

According to one embodiment of the present invention, the second active power reference and the second reactive power reference are generated based on at least the wind turbine operation strategy, the first active power reference, the first reactive power reference, the first parameter, the second parameter, the positive sequence voltage, the negative sequence voltage, and a phase angle.

According to one embodiment of the present invention, the wind turbine operation strategy is determined based on at least one of the following factors or criteria: a grid fault type, a grid fault location, a grid fault severity, a grid support requirement, a wind farm support requirement, a wind turbine performance factor, and a priority of active or reactive power injection.

According to one embodiment of the present invention, the wind turbine operation strategy may be fixed or changeable on demand. For example, the wind turbine operation strategy may be changed during operation if for some reasons the priority of active or reactive power injection changes.

According to one embodiment of the present invention, the wind turbine performance factors relate to: reducing a ripple in any one of a group consisting of: outputs of the machine-side converter like an active power supplied by a machine-side converter or a reactive power supplied by the machine-side converter, a DC link voltage, outputs of the grid-side converter like the active power supplied by the grid-side converter, or the reactive power supplied by the grid-side converter, reducing a grid voltage unbalance, maximizing the active or the reactive power or ensuring stability and support of the wind turbine and the grid. In this way, the wind turbine performance factors like reducing the ripple ensure desired performance on the machine side converter and on the grid side converter.

According to one embodiment of the present invention, the first parameter and the second parameter are chosen to respectively range between 0 and 1.

According to one embodiment of the present invention, the first parameter and the second parameter are chosen to fall outside the range extending from 0 to 1.

According to one embodiment of the present invention, the wind turbine operation strategy comprises the goal to balance a voltage at a point of common coupling, and to inject a predetermined amount of reactive power while setting the second parameter to be substantially equal to 0.

According to one embodiment of the present invention, the wind turbine operation strategy comprises the goal to boost a voltage at a point of common coupling, and to inject a predetermined amount of active power while setting the second parameter to be substantially equal to 1.

According to one embodiment of the present invention, the wind turbine operation strategy comprises the goal to reduce active power oscillations, and to inject a predetermined amount of active power and reactive power while setting the first parameter to a value which results in the best active power oscillation reduction.

Many other wind turbine operation strategies are possible besides the examples given above.

According to one embodiment of the present invention, the phase angle is equal to or substantially equal to half of the difference between the positive and negative sequence angles of the grid voltage. According to one embodiment of the present invention, the phase angle ranges between 0.45 and 0.55. Other ranges are possible.

According to one embodiment of the present invention, the current references, the positive sequence components and the negative sequence components are vector entities.

According to one embodiment of the present invention, a system for operating a wind turbine is provided. The wind turbine includes a grid side converter. The wind turbine is connectable to a grid via a power line. The system includes a wind turbine generator controlling unit configured to determine a first active power reference and a first reactive power reference indicating a requested amount of active power and reactive power, respectively, depending on a wind turbine operation strategy; a grid voltage determining unit configured to measure a grid voltage of the grid, and to determine a positive sequence component and a negative sequence component of the grid voltage i.e. a positive sequence voltage and a negative sequence voltage; a power and sequence controlling unit coupled to the wind turbine generator controlling unit and the grid voltage determining unit, the power and sequence controlling unit configured to: receive the first active power reference and the first reactive power reference from the wind turbine generator controlling unit; determine a second active power reference and a second reactive power reference indicating an actual amount of active power and reactive power to be supplied by the grid side converter to the grid, respectively, depending on at least the first active power reference, the first reactive power reference, and the wind turbine operation strategy, and generate, based on at least the wind turbine operation strategy, a first parameter and a second parameter which define a proportion of positive sequence current component and negative sequence current component to be injected by the grid side converter in order to supply active power and reactive power in accordance with the second active power reference and the second reactive power reference; a current reference controlling unit coupled to the power and sequence controlling unit and the grid voltage determining unit, the current reference controlling unit being configured to: receive the positive sequence voltage and the negative sequence voltage from the grid voltage determining unit; receive the second active power reference, the second reactive power reference, the first parameter, and the second parameter from the power and sequence controlling unit; generate a current reference based on at least the second active power reference, the second reactive power reference, the positive sequence voltage, the negative sequence voltage, the first parameter, and the second parameter; and supply the current reference to the grid side converter control system. The system can enable the wind turbine to stay connected to the grid during occurrences of asymmetrical grid faults. The system also can prevent over current related tripping of the wind turbine during occurrences of asymmetrical grid faults. The system can also handle symmetrical grid faults as mentioned before.

According to one embodiment of the present invention, in order to determine the second active power reference and the second reactive power reference, the power and sequence controlling unit is further configured to determine, based on the wind turbine operation strategy, whether an optimization of the first active power reference and the first reactive power reference has to be carried out; generate the second active power reference and the second reactive power reference such that they differ from the first active power reference and the first reactive power reference, respectively, when it is determined that an optimization has to be carried out; generate the second active power reference and the second reactive power reference such that they are identical to the first active power reference and the first reactive power reference, respectively, when it is determined that no optimization has to be carried out.

According to one embodiment of the present invention, in order to determine whether an optimization of the first active power reference and the first reactive power reference has to be carried out, the power and sequence controlling unit is further configured to determine whether the current reference would cause, when calculated based on the first active power reference and the first reactive power reference, the grid side converter to supply power to the grid having a current component which exceeds a grid side converter current limit, wherein the power and sequence controlling unit is further configured to generate, if the current component exceeds the grid side converter current limit, the second active power reference and the second reactive power reference such that the resulting current component of the supplied power remains below the grid side converter current limit.

According to one embodiment of the present invention, in order to determine whether the current component would exceed the grid side converter current limit, the power and sequence controlling unit is further configured to calculate, for each phase of the power line, a maximum current that would result if the current reference was generated, the calculation being carried out based on at least the turbine operation strategy, the first active power reference, the first reactive power reference, the positive sequence voltage, the negative sequence voltage, the first parameter, the second parameter, and a phase angle; compare the maximum current of each phase with a grid side converter phase current limit; determine that the current component exceeds the grid side converter current limit when one of the maximum phase currents exceeds the corresponding grid side converter phase current limit.

According to one embodiment of the present invention, in order to determine the maximum current for each phase, the power and sequence controlling unit is configured to determine an active current ellipse defined at least by the first parameter, the positive sequence voltage, the negative sequence voltage, and the first active power reference, and determining a reactive current ellipse defined at least by the second parameter, the positive sequence voltage, the negative sequence voltage, the in-quadrature positive sequence voltage, the in-quadrature negative sequence voltage, and the first reactive power reference, add the active current ellipse and the reactive current ellipse in order to obtain a combined current ellipse, rotate the combined current ellipse about the phase angle, determine the maximum projections of the combined current ellipse onto the abc axes corresponding to a three phase system, wherein each projection on abc axes corresponds to a maximum current in the respective abc phases of the three phase system.

According to one embodiment of the present invention, in order to determine whether an optimization the first active power reference and the first reactive power reference has to be carried out, the power and sequence controlling unit is further configured to determine whether the second active power reference and the second reactive power reference are to be generated in dependence on priority levels indicating whether regulating the active power or regulating the reactive power to corresponding power reference levels has higher priority, wherein the power and sequence controlling unit is farther configured to generate the second active power reference and the second reactive power reference in dependence on the priority levels if the priority levels are to be considered.

According to one embodiment of the present invention, the power and sequence controlling unit is further configured to check whether the second active power reference falls within a predetermined active power range, or whether the second reactive power reference falls within a predetermined reactive power range, and change the second active power reference or the second reactive power reference to fall within the predetermined power ranges when the second active power reference and/or the second reactive power reference do not fall within the predetermined power ranges.

According to one embodiment of the present invention the power and sequence controlling unit is further configured to replace the second active power reference by an upper limit value of the predetermined active power range if the second active power reference exceeds the upper limit value, or replace the second active power reference by a lower limit value of the predetermined active power range if the second active power reference falls below the lower limit value, and replace the second reactive power reference by an upper limit value of the predetermined reactive power range if the second reactive power reference exceeds the upper limit value, or replace the second reactive power reference by a lower limit value of the predetermined reactive power range if the second reactive power reference falls below the lower limit value.

According to one embodiment of the present invention, a wind turbine including a system as described in the embodiments above is provided.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 12 shows a table of peak values of three phase injected currents according to an embodiment of the present invention.

DETAILED DESCRIPTION

Figure 1:
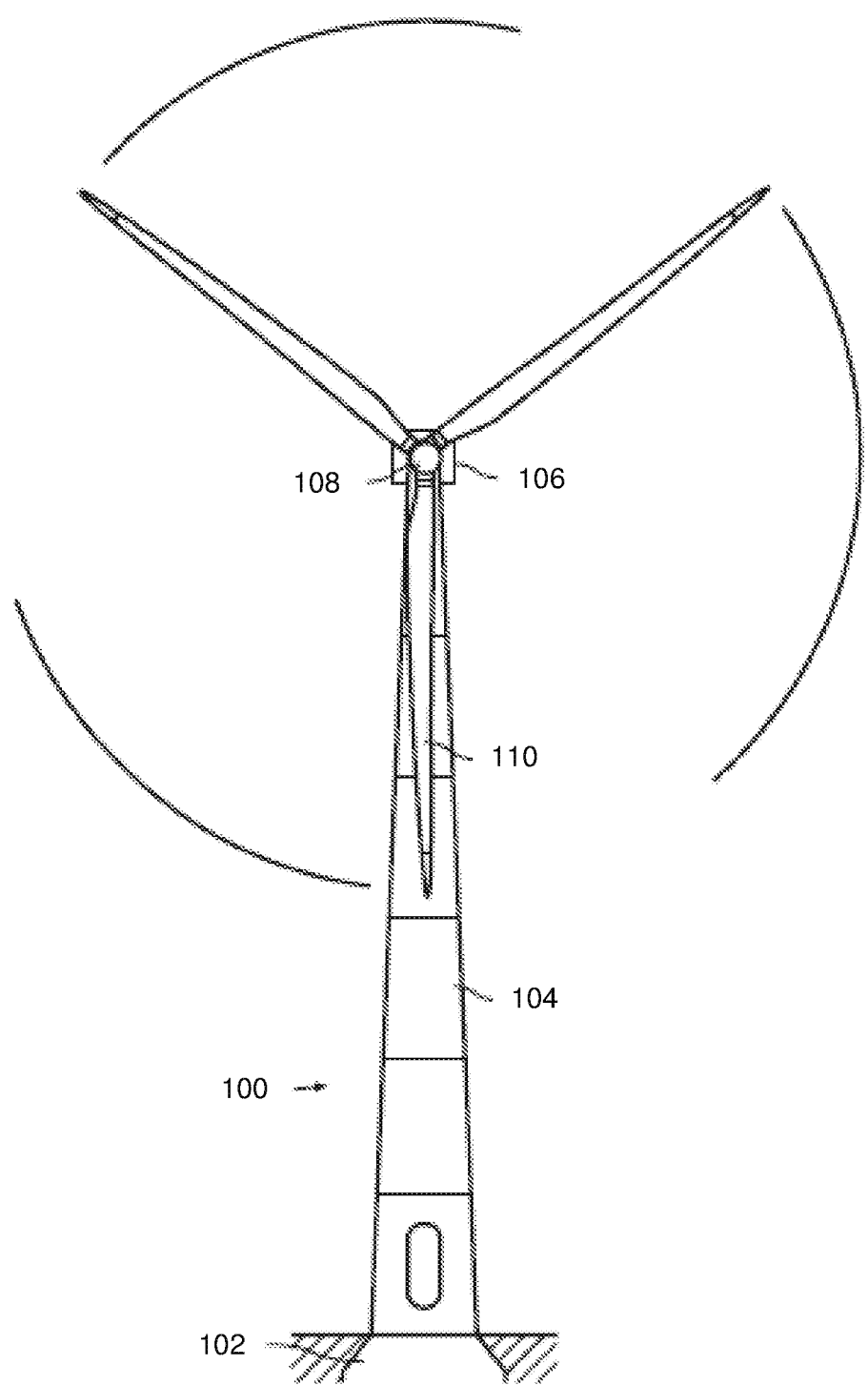
FIG. 1 illustrates a common setup of a conventional wind turbine.

FIG. 1 illustrates a common setup of a conventional wind turbine 100. The wind turbine 100 is mounted on a base 102. The wind turbine 100 includes a tower 104 having a number of tower sections. A wind turbine nacelle 106 is placed on top of the tower 104. The wind turbine rotor includes a hub 108 and at least one rotor blade 110, e.g. three rotor blades 110. The rotor blades 110 are connected to the hub 108 which in turn is connected to the nacelle 106 through a low speed shaft which extends out of the front of the nacelle 106. The low speed shaft typically drives a generator (not shown) for producing electrical power. The electrical power generated is thereafter usually conditioned by a converter system (not shown), comprising a power converter, prior to delivery from the wind turbine to a grid.

Grid-connected power converters should be designed and controlled bearing in mind that they should guarantee a proper operation under generic grid voltage conditions. It is worth to remark that the electrical network is a dynamical system, whose behavior depends upon many factors, as for instance constrains set by power generation systems, the occurrence of grid faults and other contingencies, the excitation of resonances or the existence of non-linear loads. Under these conditions, modern power converters should provide a reliable response, being especially important to design control algorithms that ensures a robust and safe performance under abnormal grid conditions.

The ever increasing integration of distributed generation systems, which should fulfill the tight requirements imposed by the grid operator, mainly regarding low-voltage ride-through and grid support during transient grid faults, has encouraged engineers and researchers to improve the conventional control solutions for grid-connected power converters. Despite the fact that the control of power converters under abnormal grid conditions is not a new issue, most of the studies within this field were mainly focused to the control of active rectifiers. The main concern in such applications was to guarantee a proper performance at the dc side of the converter under grid faults. In the grid connection of distributed generators the interaction between the power converter and the networks under balanced and unbalanced faults is a crucial matter, since it is not only necessary to guarantee that any protection of the converter would trip but also to support the grid under such faulty operating conditions.

Occurrences of asymmetrical grid faults usually give rise to the appearance of unbalanced grid voltages at the point of connection of power converter. Under unbalanced conditions, the currents injected into the grid may lose their sinusoidal and balanced appearance. The interaction between such currents and the unbalanced grid voltages may give rise to controlled or uncontrolled oscillations in the active and reactive power delivered to the network. The proper operation of the power converter under such conditions is a challenging control issue. However, the injection of unbalanced currents also give rise to other useful effects. For instance, the injection of a proper set of unbalanced currents under unbalanced grid voltage conditions allow attenuating power oscillations, maximizing the instantaneous power delivery, or balancing the grid voltage at the point of connection. However, the injection of unbalanced currents into the grid cannot be accurately achieved by using most of the conventional current controllers used in the industry. For this reason, some improved control structures are specifically designed to inject unbalanced currents into the grid.

Depending on the objective of the control strategy used to generate the reference currents during grid faults, the overall performance of the power converter and its interaction with the electrical grid will vary considerably. Moreover, the grid codes regulating the connection of wind turbines systems state specific requirements regarding the injection of active and reactive power during grid faults. Therefore, reference current generation under grid faults is another crucial issue in the control of power converters.

The currents injected by the power converter into the phases of the grid should be always under control, even though the grid voltage experiences strong variations. Therefore, the control algorithms setting the reference currents should estimate the instantaneous performance of these phase currents at any time, even during transient faults, in order to avoid any over current tripping. For this reason, the last but not the less important issue is related to the calculation of the maximum power that can be delivered to the grid, without over passing the current limits of the power converter.

Figure 2:
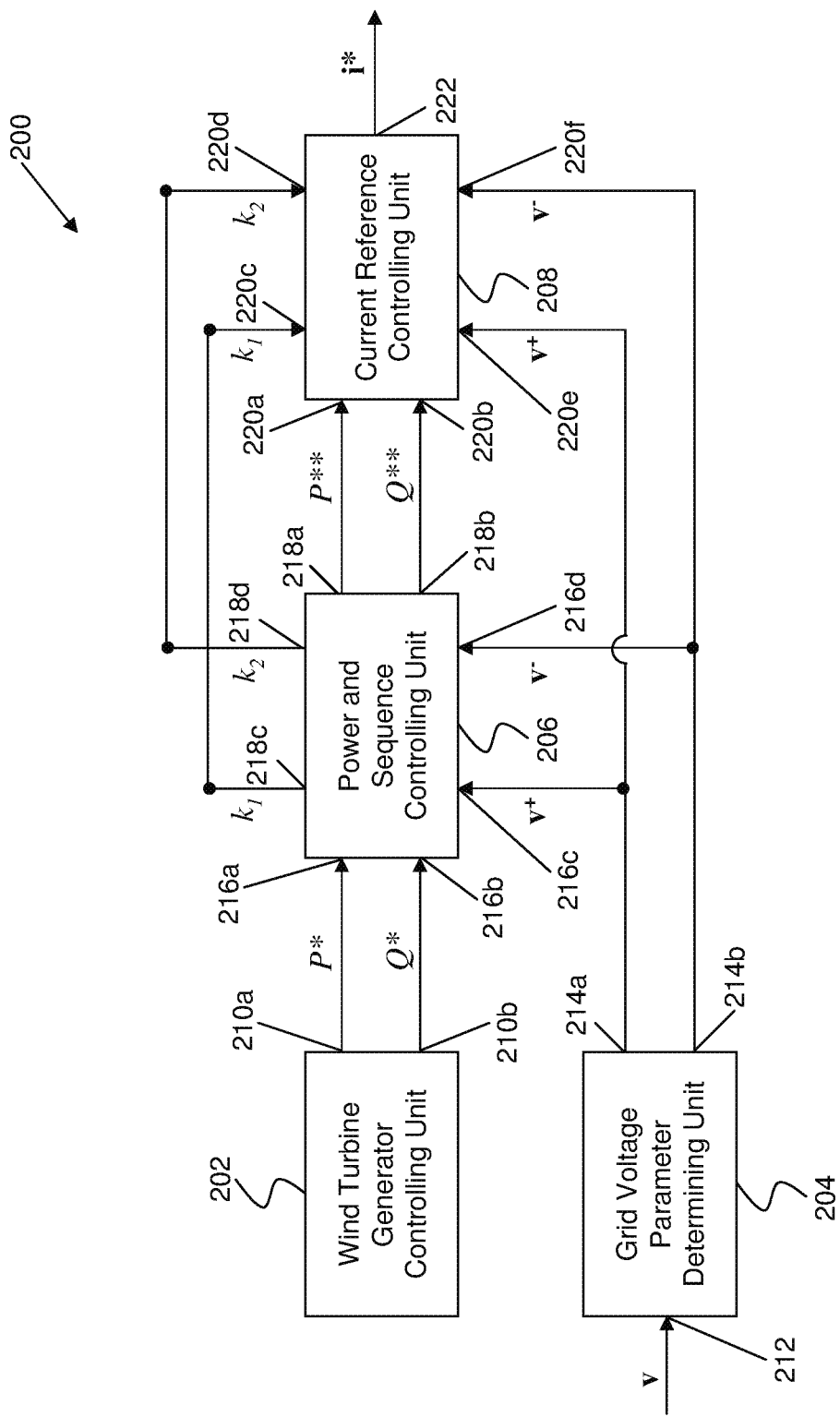
FIG. 2 shows a schematic block diagram of a system for operating a wind turbine according to an embodiment of the present invention.

FIG. 2 shows a schematic block diagram of a system 200 for operating a wind turbine. The system 200 includes a wind turbine generator controlling unit 202 grid voltage determining unit 204 like a PLL (phase locked loop) unit, a power and sequence controlling unit 206 and a current reference controlling unit 208. As per FIG. 2, the wind turbine generator controlling unit 202 has at least two output terminals 210*a-b* among other various outputs. The grid voltage determining unit 204 has at least one input terminal 212 and at least two output terminals 214*a-b*. The power and sequence controlling unit 206 has at least four input terminals 216*a-d* and at least four main output terminals 218*a-d*. The current reference controlling unit 208 has at least six input terminals 220*a-f* and at least one output terminal 222.

The numbers of input terminals and output terminals shown in FIG. 2 are to be understood as examples and may be different in other embodiments. The number of input terminals and output terminals may for example be respectively dependent on the number of inputs and the number of outputs. For example, the grid voltage determining unit 204 may have three input terminals 212. The grid voltage determining unit 204 may also have five output terminals 214 for outputting signals indicative of a positive sequence voltage of a grid voltage, a negative sequence voltage of the grid voltage, an angle which is equal to or substantially equal to half of a difference between positive and negative sequence angles of the grid voltage, an angle of a voltage vector and speed of rotation of the voltage vector. The current reference controlling unit 208 may have for example four output terminals 222. Other numbers of terminals are possible.

In one embodiment, the two output terminals 210*a-b* of the wind turbine generator controlling unit 202 are respectively coupled to the first and the second input terminals 216*a-b* of the power and sequence controlling unit 206. The two output terminals 244*a-b* of the grid voltage determining unit 204 are respectively coupled to the third and the fourth input terminals 216*c-d* of the power and sequence controlling unit 206. The four output terminals 218*a-d* of the power and sequence controlling unit 206 are respectively coupled to the first to the fourth input terminals 220a-d of the current reference controlling unit 208. The two output terminals 244a-b of the grid voltage determining unit 204 are also respectively coupled to the fifth and the sixth input terminals 220e-f of the current reference controlling unit 208.

In one embodiment, the wind turbine generator controlling unit 202 determines a first active power reference P* and a first reactive power reference Q* indicating a requested amount of active power and a requested amount of reactive power to be supplied by a grid side converter to a grid, respectively, depending on a wind turbine operation strategy. The wind turbine operation strategy may for example take into account at least one of the following factors or criteria: a grid fault type, a grid fault location, a grid fault severity, a grid support requirement, a wind farm support requirement, a wind turbine performance factor, and a priority of active or reactive power injection. The wind turbine performance factors may relate to reducing a ripple in any one of a group consisting of: outputs of the machine-side converter like an active power supplied by a machine-side converter or a reactive power supplied by the machine-side converter, a DC link voltage, outputs of the grid-side converter like the active power supplied by the grid-side converter, or the reactive power supplied by the grid-side converter. The wind turbine performance factors may further relate to reducing a grid voltage unbalance, maximizing the active or the reactive power or ensuring stability and support of the wind turbine and the grid. In this way, the wind turbine performance factors like reducing the ripple ensure desired performance on the machine side converter and on the grid side converter.

The wind turbine generator controlling unit 202 may transmit signals indicating the active power reference P* and the reactive power reference Q* to the power and sequence controlling unit 206 via the two output terminals 210a-b respectively.

The grid voltage determining unit 204 measures a grid voltage v of the grid. The grid voltage v may symbolize several voltages depending on the number of phases. For example, if the number of phases is three (a three phase electrical system), the grid voltage v would represent 3 phase voltages. The grid voltage v may be determined by measuring a phase-to-ground voltage. Similar, terminal 212 may symbolize a varying number of terminals, depending on the number of phases. The grid voltage v is input into the grid voltage determining unit 204 via the input terminal 212. The grid voltage determining unit 204 determines a positive sequence voltage $v^+$ and a negative sequence voltage $v^-$ from the grid voltage v. The grid voltage determining unit 204 transmits signals indicating the positive sequence voltage v and the negative sequence voltage $v^-$ to the power and sequence controlling unit 206 and the current reference controlling unit 208 via the two output terminals 214a-b respectively.

The power and sequence controlling unit 206 receives the signals indicating the first active power reference P* and the first reactive power reference Q* from the wind turbine generator controlling 202 via the first and the second input terminals 216a-b respectively. The power and sequence controlling unit 206 receives the signals indicating the positive sequence voltage $v^+$ and the negative sequence voltage $v^-$ from the grid voltage determining unit 204 via the third and the fourth input terminals 216c-d respectively. The power and sequence controlling unit 206 determines a second active power reference P and a second reactive power reference Q indicating an actual amount of active power and reactive power to be supplied by the grid side converter to the grid, respectively, depending on at least the first active power reference P*, the first reactive power reference Q*, and the wind turbine operation strategy.

In order to determine the second active power reference P and the second reactive power reference Q, the power and sequence controlling unit, the power and sequence controlling unit 206 may determine, based on the wind turbine operation strategy, whether an optimization of the first active power reference P* and the first reactive power reference Q* has to be carried out. If it is determined that the optimization has to be carried out, the power and sequence controlling unit 206 may generate the second active power reference P the second reactive power reference Q such that they differ from the first active power reference P* and the first reactive power reference Q*. When it is determined that no optimization has to be carried out, the power and sequence controlling unit 206 may generate the second active power reference P and the second reactive power reference Q such that they are identical to the first active power reference P* and the first reactive power reference Q* respectively. In order to determine whether an optimization of the first active power reference P* and the first reactive power reference Q* has to be carried out, the power and sequence controlling unit 206 may determine whether a current reference i*, when calculated based on the first active power reference P* and the first reactive power reference Q*, would cause the grid side converter to supply power to the grid having a current component which exceeds a grid side converter current limit $I_{lim}$. If the current component exceeds the grid side converter current limit $I_{lim}$, the power and sequence controlling unit 206 may generate the second active power reference P and the second reactive power reference Q such that the resulting current component of the supplied power remains below the grid side converter current limit $I_{lim}$.

In order to determine whether the current component would exceed the grid side converter current limit $I_{lim}$, power and sequence controlling unit 206 may calculate, for each phase of the power line, a maximum current that would result if the current reference i* was generated. The calculation of the maximum current may be carried out based on at least the turbine operation strategy, the first active power reference P*, the first reactive power reference Q*, the first parameter $k_1$, the second parameter $k_2$, the positive sequence voltage $v^+$ and the negative sequence voltage v and a phase angle δ. The phase angle δ may be equal to or substantially equal to the half of a difference between positive and negative sequence angles of the grid voltage v. The phase angle δ may be used to determine peak values of the current.

In one embodiment, to determine the maximum current of each phase, the following formula may be employed:

$$\hat{i} = \sqrt{\left[P^* \cdot \left(\frac{k_1}{|v^+|} + \frac{(1-k_1)}{|v^-|}\right) \cdot \cos\gamma - Q^* \cdot \left(\frac{k_2}{|v^+|} + \frac{(1-k_2)}{|v^-|}\right) \cdot \sin\gamma\right]^2 + \left[Q^* \cdot \left(\frac{k_2}{|v^+|} + \frac{(1-k_2)}{|v^-|}\right) \cdot \cos\gamma - P^* \cdot \left(\frac{k_1}{|v^+|} + \frac{(1-k_1)}{|v^-|}\right) \cdot \sin\gamma\right]^2}$$

wherein P* is the first active power reference, Q* first reactive power reference, $k_1$ is the first parameter, $k_2$ is the second parameter, $v^+$ is the positive sequence voltage, $v^-$ is the negative sequence voltage, and γ is an angle of a voltage vector of the grid voltage.

In order to determine the maximum current each phase, the power and sequence controlling unit 206 may determine an active current ellipse defined by the first parameter $k_1$, ire positive sequence voltage $v^+$, negative sequence voltage $v^-$, and the first active power reference P*, and determining a reactive current ellipse defined by the second parameter $k_2$, the positive sequence voltage $v^+$, the negative sequence voltage $v^-$, the in-quadrature positive sequence voltage $v_\perp^+$, the in-quadrature negative sequence voltage $v_\perp^-$, and the first reactive power reference Q*. The power and sequence controlling unit 206 may add the active current ellipse and the reactive current ellipse in order to obtain a combined current ellipse. The power and sequence controlling unit 206 may rotate the combined current ellipse about the phase angle δ. The current reference controlling unit 208 may determine the maximum projections of the combined current ellipse onto the abc axes corresponding to a three phase system. Each projection on abc axes corresponds to a maximum current in the respective abc phases of the three phase system.

In order to determine whether an optimization of the first active power reference P* and the first reactive power reference Q* has to be carried out, the power and sequence controlling unit 206 may also determine whether the second active power reference P and the second reactive power reference Q are to be generated in dependence on priority levels indicating whether regulating the active power or regulating the reactive power to corresponding power reference levels has higher priority. The power and sequence controlling unit 206 may generate the second active power reference P and the second reactive power reference Q in dependence on the priority levels if the priority levels are to be considered.

The power and sequence controlling unit 206 may check whether the second active power reference P falls within a predetermined active power range, or whether ire second reactive power reference Q falls within a predetermined reactive power range. The power and sequence controlling unit 206 may change the second active power reference P or the second reactive power reference Q to fall within the predetermined power ranges when the second active power reference P the second reactive power reference Q do not fall within the predetermined power ranges. The power and sequence controlling unit 206 may replace the second active power reference P by an upper limit value of the predetermined active power range if the second active power reference P exceeds the upper limit value, or replace the second active reference P by a lower limit value of the predetermined active power range if the second active power reference P falls below the lower limit value. The power and sequence controlling unit 206 may replace the second reactive power reference Q by an upper limit value of the predetermined reactive power range if the second reactive power reference Q exceeds the upper limit value, or replace the second reactive power reference Q by a lower limit value of the predetermined reactive power range if the second reactive power reference Q falls below the lower limit value.

The power and sequence controlling unit 206 may transmit signals indicating second active power reference P, the second reactive power reference Q, the first parameter $k_1$ and the second parameter $k_2$ to the current reference con rolling unit 208 via the four output terminals 218a-d respectively.

The current reference controlling unit 208 receives the signals indicating second active power reference P, the second reactive power reference Q, the first parameter $k_1$ and the second parameter $k_2$ from the power and sequence controlling unit 206 via the first to fourth input terminals 220a-d respectively. The current reference controlling unit 208 receives the signals indicating the positive sequence voltage $v^+$ and the negative sequence voltage from the grid voltage determining unit 204 via the fifth and the sixth input terminals 216e-f respectively.

The current reference controlling unit 208 may generate a current reference i* based on at least the second active power reference P, the second reactive power reference Q, the positive sequence voltage $v^+$, the negative sequence voltage $v^-$, the first parameter $k_1$, and the second parameter $k_2$. The current reference controlling unit 208 may supply the current reference i* to the grid side converter which supplies active and reactive power to the power line based on the current reference i*.

Figure 3:
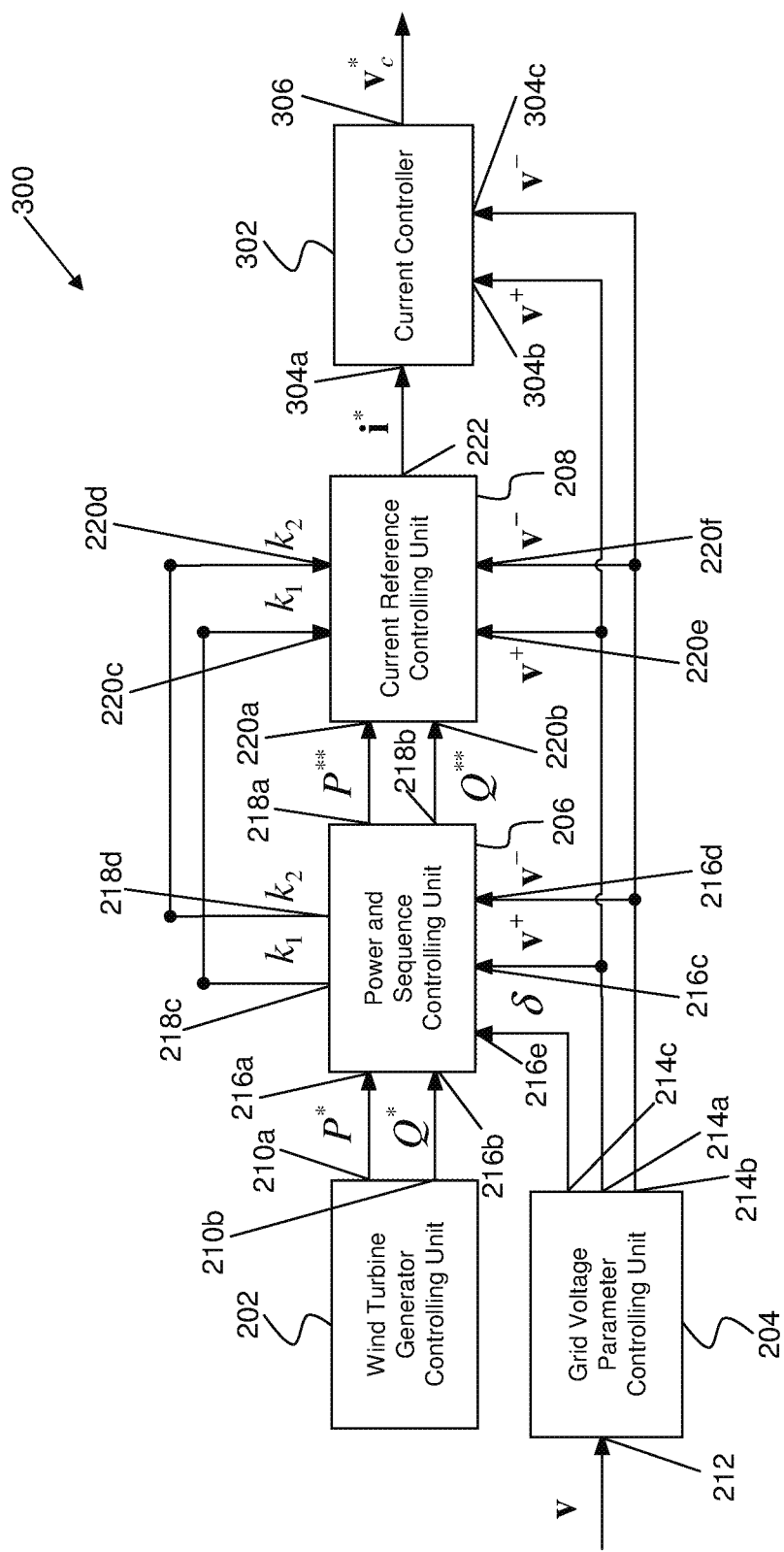
FIG. 3 shows a schematic block diagram of a system for operating a wind turbine according to an embodiment of the present invention.

FIG. 3 shows a schematic block diagram of another example 300 of the system for operating the wind turbine. In this embodiment, the grid voltage determining unit 204 has a third output terminal 214c and the power and sequence controlling unit 206 has a fifth input terminal 216e. The grid voltage determining unit 204 generates a phase angle δ which may be equal to or substantially equal to half of a difference between positive and negative sequence angles of the grid voltage v, and transmits a signal indicating the phase angle δ to the power and sequence controlling unit 206 via the third output terminal 214c. The power and sequence controlling unit 206 receives the signal indicating the phase angle δ from the grid voltage determining unit 204 via the fifth input terminal 216e.

In addition, the system 300 includes a current controller block 302 having three input terminals 304a-c and an output terminal 306. The first input terminal 304a of the current controller block 302 is coupled to the output terminal 222 of the current reference controlling unit 208. The second and third input terminals 304b-c are respectively coupled to the first and second output terminals 214a-b of the grid voltage determining unit 204.

The number of input terminals and output terminals are only examples and may be different other embodiments. For example, the number of input terminals and output terminals may be respectively dependent on the number of inputs and the number of outputs. In one embodiment, the current controller block 302 may for example have more than three input terminals 304. The current controller block 302 may for example have two output terminals 306a, 306b respectively outputting signals indicative of $v_\alpha$ and $v_\beta$ which correspond to the voltage output of the grid side converter.

The current controller block 302 receives the signal indicating the current reference i* from the current reference controlling unit 208 via the first input terminal 304a. The current controller block 302 receives the signals indicating the positive sequence voltage $v^+$ and the negative sequence voltage $v^-$ from the grid voltage determining unit 204 via the second and third input terminals 304b-c. The current controller block 302 may generate a voltage reference $v_c^*$ and may transmit a signal indicating the voltage reference $v_c^*$ via the output terminal 306. The voltage reference $v_c^*$ may be in ($v_\alpha$, $v_\beta$) or in ($v_a$, $v_b$, $v_c$) form depending on the type of PWM implementation.

The system 200/300 enables the wind turbine to stay connected to the grid during occurrences of asymmetrical grid faults. The system 200/300 also prevents over current tripping of the wind turbine at such instances. The systems 200/300 can handle symmetrical grid faults with the slight modifications described earlier. That is, in the case of symmetrical grid faults, a slight modification in the control strategy related to negative sequence voltages may be needed especially when the magnitude of negative sequence voltages is very small. However, the basic controlling mechanism is fundamentally the same for asymmetrical grid faults and symmetrical grid faults. It should be noted that for symmetrical grid fault handling, the first parameter and the second parameter will respectively be substantially close to 1.

Figure 4:
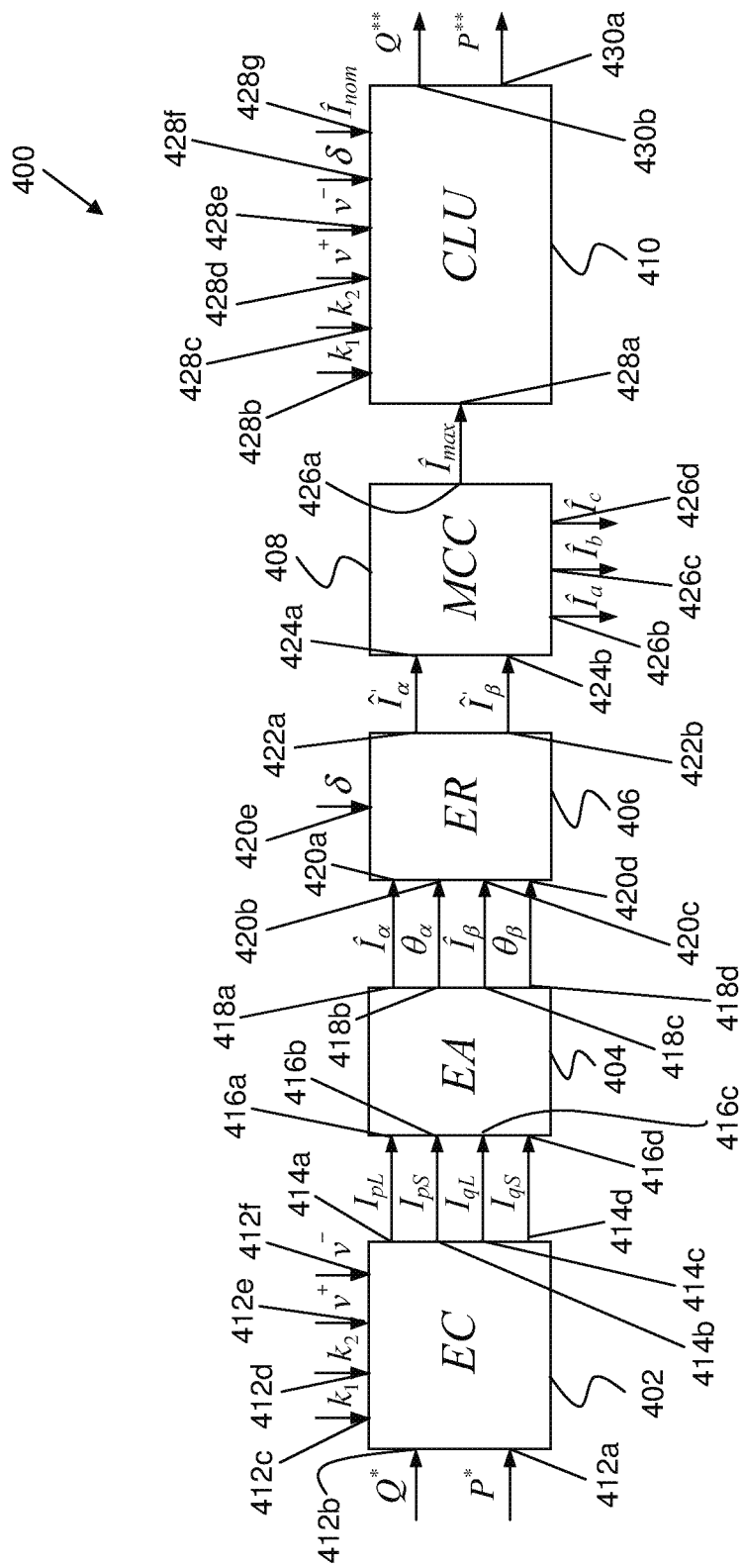
FIG. 4 shows a schematic block diagram of a power reference calculator block usable in a system for operating a wind turbine according to an embodiment of the present invention.

FIG. 4 shows a schematic block diagram of an embodiment of the power and sequence controlling unit 206. The power and sequence controlling unit 206 includes a power reference calculator block 400 as shown in FIG. 4. The power reference calculator block 400 includes an ellipse calculator block 402, an ellipse addition block 404, an ellipse rotation block 406, a maximum current calculator block 408 and a current limiting unit 410. The ellipse calculator block 402 has six input terminals 412a-f and four output terminals 414a-d. The ellipse addition block 404 has four input terminals 416a-d and four output terminals 418a-d. The ellipse rotation block 406 has five input terminals 420a-e and two output terminals 422a-b. The maximum current calculator block 408 has two input terminals 424a-b and four output terminals 426a-d. The current limiting unit 410 has seven input terminals 428a-g and two output terminals 430a-b. The number of input terminals and output terminals are only examples and may be different in other embodiments. The number of input terminals and output be respectively dependent on the number of inputs and the number of outputs. For example, the ellipse addition block 404 may have more than four output terminals 418. The maximum current calculator block 408 may for example have one output terminal 426. The current unit 410 may for example have six input terminals 428a-f, since for example data input terminal 428g may be a parameter already pre-stored within the current limiting unit 410, and there is no need to input it. In the same manner, other terminals may be omitted if the corresponding parameters are already pre-stored within the current limiting unit 410.

The four output terminals 414a-d of the ellipse calculator block 402 are respectively coupled to the four input terminals 416a-d of the ellipse addition block 404. The four output terminals 418a-d of the ellipse addition block 404 are respectively coupled to the four input terminals 420a-d of the ellipse rotation block 406. The two output terminals 422a-b of the ellipse rotation block 406 are respectively coupled to the two input terminals 424a-b of the maximum current calculator block 408. One output terminal 426a of the maximum current calculator block 408 is coupled to one input terminal 428a of the current limiting unit 410. The number of input terminals and output terminals are only examples and may be different in other embodiments. The number of input terminals and output terminals may be respectively dependent on the number of inputs and the number of outputs.

The six input terminals 412a-f of the ellipse calculator block 402 respectively receive signals indicating a first active power reference P*, a first reactive power reference Q*, a first parameter $k_1$, a second parameter $k_2$, a positive sequence voltage $v^+$, and a negative sequence voltage $v^-$. The ellipse calculator block 402 calculates axes ($I_{pL}$, $I_{pS}$) of an active current elliptical locus and axes ($I_{qL}$, $I_{qS}$) of a reactive current elliptical locus. The four output terminals 414a-d of the ellipse calculator block 402 respectively transmit signals indicating axes ($I_{pL}$, $I_{pS}$) of the active current elliptical locus and the axes of ($I_{qL}$, $I_{qS}$) of the reactive current elliptical locus to the ellipse addition block 404. The ellipse addition block 404 receives the signals indicating the axes ($I_{pL}$, $I_{pS}$) of the active current elliptical locus and the axes of ($I_{qL}$, $I_{qS}$) of the reactive current elliptical locus via the four input terminals 416a-d respectively. The ellipse addition block 404 calculates currents ($\hat{I}_\alpha$, $\hat{I}_\beta$) with angles ($\theta_\alpha$, $\theta_\beta$) of the resulting ellipse by adding the active current ellipse and the reactive current ellipse. The four output terminals 418a-d of the ellipse addition block 404 respectively transmit signals indicating the currents ($\hat{I}_\alpha$, $\hat{I}_\beta$) and angles ($\theta_\alpha$, $\theta_\beta$) of the resulting ellipse to the ellipse rotation block 406. Details of the adding of the active current ellipse and the reactive current ellipse and the calculation of currents ($\hat{I}_\alpha$, $\hat{I}_\beta$) and the angles ($\theta_\alpha$, $\theta_\beta$) are explained in the later parts of the description (with reference to equations (1.15) to (1.23)).

The ellipse rotation block 406 receives the signals indicating the currents ($\hat{I}_\alpha$, $\hat{I}_\beta$) and angles ($\theta_\alpha$, $\theta_\beta$) of the resulting ellipse via the first to fourth input terminals 420a-d respectively, and receives a signal indicating a phase angle $\delta$ (which may be equal to or substantially equal to the half of a difference between the positive and negative sequence angles of the grid voltage (v)) via the fifth input terminal 420e. The ellipse rotation block 406 performs a rotation of the resulting ellipse received from the ellipse addition block 404, and transmits signals indicating current components ($\hat{I}_\alpha'$, $\hat{I}_\beta'$) of the rotated ellipse via the two output terminals 422a-b to the maximum current calculator block 408. The maximum current calculator block 408 receives the signals indicating the current components ($\hat{I}_\alpha'$, $\hat{I}_\beta'$) of the rotated ellipse via the two input terminals 424a-b respectively. The maximum current calculator block 408 calculates the maximum current in each phase ($\hat{I}_a$, $\hat{I}_b$, $\hat{I}_c$) of the three phase system, and the maximum overall current $\hat{I}_{max}$. The first output terminal 426a of the maximum current calculator block 408 transmits a signal indicating the maximum overall current $\hat{I}_{max}$ to the current limiting unit 410. The second to fourth output terminals 426b-d of the maximum current calculator block 408 respectively transmit signals indicating the maximum current in each phase ($\hat{I}_a$, $\hat{I}_b$, $\hat{I}_c$). The current limiting unit 410 receives the signal indicating the maximum overall current $\hat{I}_{max}$ via a first input terminal 428a, and receives the signals indicating the first parameter $k_1$ second parameter $k_2$, the positive sequence voltage $v^+$, the negative sequence voltage $v^-$, the phase angle $\delta$, and a nominal current value $\hat{I}_{nom}$ (e.g. grid side converter current limit $I_{lim}$) via the second to seventh input terminals 428b-g respectively. The nominal current value $\hat{I}_{nom}$ may be used as a parameter of the current limiting unit 410. That is, it is not necessary for the nominal current value $\hat{I}_{nom}$ to be inputted into the current limiting unit 410 since it may already be pre-stored within the current limiting unit 410. The current limiting unit 410 generates a second active power setpoint P and a second reactive power setpoint Q according to the nominal current value $\hat{I}_{nom}$. The two output terminals 430a-b of the current limiting unit 410 respectively transmit signals indicating the second active power setpoint P and the second reactive power setpoint Q.

Figure 5:
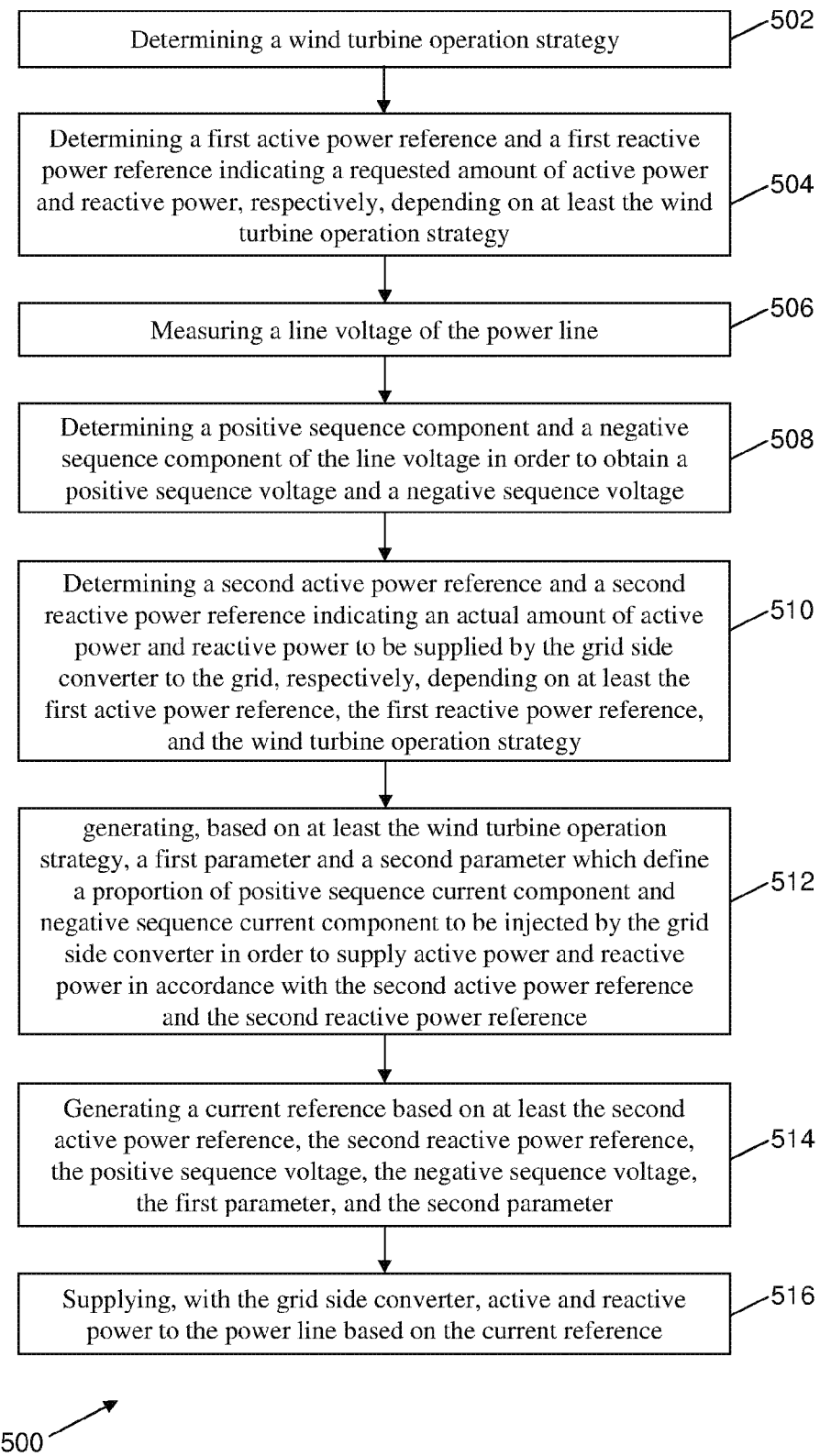
FIG. 5 shows a flow chart diagram of a method for operating a wind turbine according to an embodiment of the present invention.

FIG. 5 shows a flowchart diagram 500 of a method for operating a wind turbine. At 502, a wind turbine operation strategy is determined. At 504, a first active power reference and a first reactive power reference indicating a requested amount of active power and reactive power, respectively, are determined depending on at least the wind turbine operation strategy. At 506, a grid voltage of the grid is measured. At 508, a positive sequence component and a negative sequence component of the grid voltage are determined i.e. a positive sequence voltage and a negative sequence voltage. At 510, a second active power reference and a second reactive power reference indicating an actual amount of active power and reactive power to be supplied by the grid side converter to the grid, respectively, are determined depending on at least the first active power reference, the first reactive power reference, and the wind turbine operation strategy. Preferably, before the second active power reference and the second reactive power reference are generated, it is determined whether a current reference, when calculated based on the first active power reference and the first reactive power reference, would cause the grid side converter to supply power to the grid having a current component which exceeds a grid side converter current limit, if the current component exceeds the grid side converter current limit, the second active power reference and the second reactive power reference are generated such that the resulting current component of the supplied power remains below the grid side converter current limit. At 512, a first parameter and a second parameter, which define a proportion of positive sequence current component and negative sequence current component to be injected by the grid side converter into the power line in order to supply active power and reactive power, is generated, based on the wind turbine operation strategy, in accordance with the second active power reference and the second reactive power reference. At 514, a current reference is generated based on at least the second active power reference, the second reactive power reference, the positive sequence voltage, the negative sequence voltage, first parameter, and the second parameter. At 516, active and reactive power supplied to the power line by the grid side converter based on the current reference.

Figure 6:
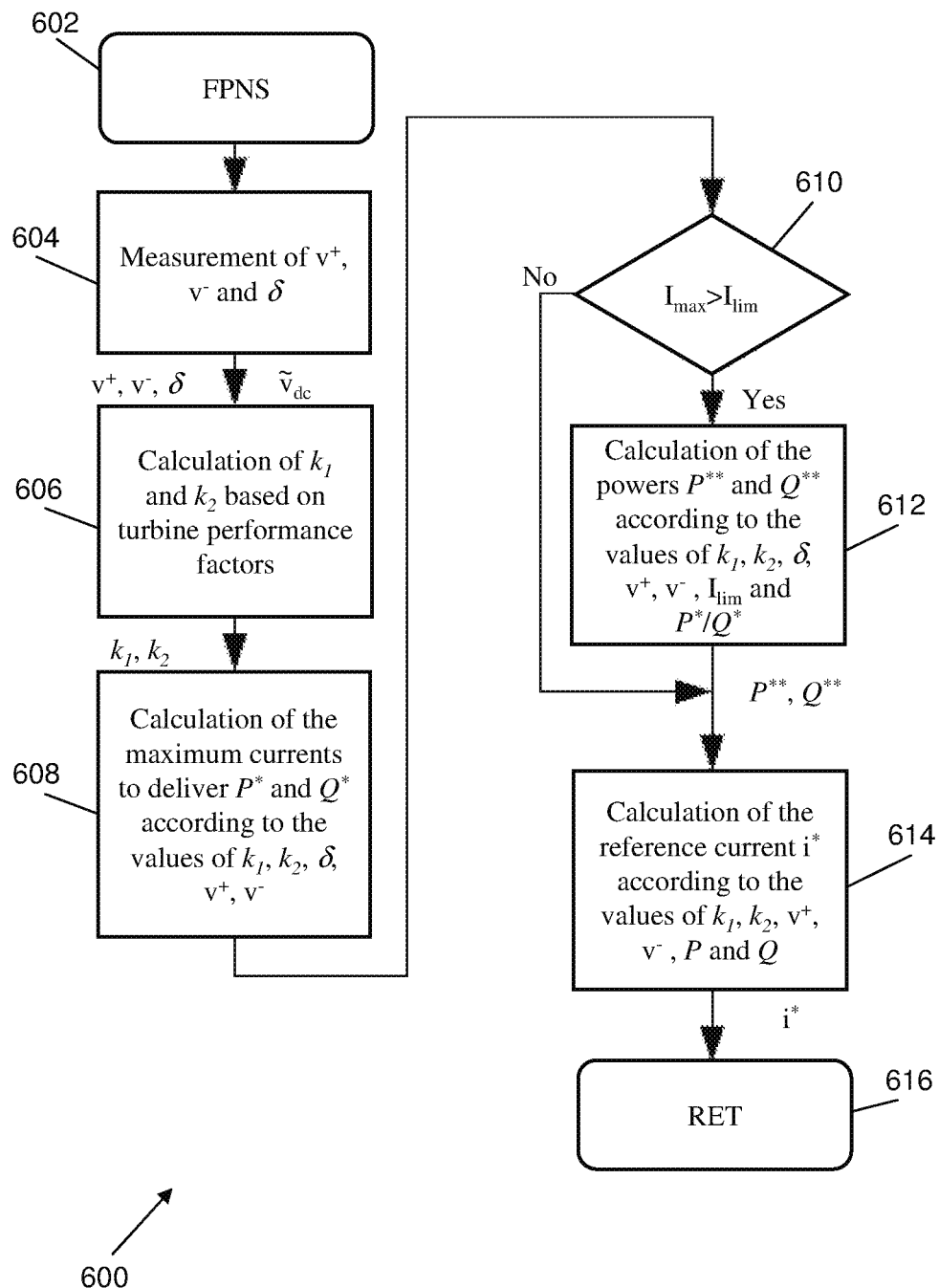
FIG. 6 shows a flow chart diagram of a method for operating a wind turbine according to an embodiment of the present invention.

FIG. 6 shows a flowchart diagram 600 of a method for operating a wind turbine. At 602, a process for determining a current reference for a power converter of a wind turbine begins. A wind turbine operation strategy is deter pined. The wind turbine operation strategy may be determined based on at least one of the following factors or criteria: a grid fault type, a grid fault location, a grid fault severity, a grid support requirement, a wind farm support requirement, a wind turbine performance factor, and a priority of active or reactive power injection. The wind turbine performance factor may relate to: reducing a ripple in any one of a group consisting of outputs of the machine-side converter like an active power supplied by a machine-side converter or a reactive power supplied by the machine-side converter, a DC link voltage, outputs of the grid-side converter like the active power supplied by the grid-side side converter or the reactive power supplied by the grid-side converter, reducing a grid voltage unbalance, maximizing the active or the reactive power or ensuring stability and support of the wind turbine and the grid. In this way, the wind turbine performance factors like reducing the ripple ensure desired performance on the machine side converter and on the grid side converter. In one embodiment, the wind turbine operation strategy may include the goal to balance a voltage at a point of common coupling, and to inject a predetermined amount of reactive power while setting the second parameter $k_2$ to be substantially equal to 0. In another embodiment, the wind turbine operation strategy may include the goal to boost a voltage at a point of common coupling, and to inject a predetermined amount of active power while setting the second parameter $k_2$ to be substantially equal to 1. In yet another embodiment, ire wind turbine operation strategy may include the goal to reduce active power oscillations, and to inject a predetermined amount of active power and reactive power while setting the first parameter $k_1$ to a value which results in the best active power oscillation reduction.

A first active power reference P* and a first reactive power reference Q* indicating a requested amount of active power and reactive power, respectively, is determined depending on at least the wind turbine operation strategy. A grid voltage of grid is measured. At 604, a positive sequence component and a negative sequence component of the grid voltage are determined i.e. a positive sequence voltage $v^+$ and a negative sequence voltage $v^-$. A phase angle $\delta$, which may be equal to or substantially equal to half of a difference between positive and negative sequence angles of the grid voltage v is determined.

At 606, a first parameter $k_1$ and a second parameter $k_2$ are determined. The first parameter $k_1$ and the second parameter $k_2$ may be determined based on wind turbine performance factors and operation strategy. The first parameter $k_1$ may indicate the proportion of positive sequence current component and negative sequence current component for the amount of active power to be supplied by the grid side converter. The second parameter $k_2$ may indicate the proportion of positive sequence current component and negative sequence current component for the amount of reactive power to be supplied by the grid side converter. In one embodiment, the first parameter $k_1$ and the second parameter $k_2$ may be chosen to respectively range between 0 and 1. In another embodiment, the first parameter $k_1$ and the second parameter $k_2$ may be chosen to fall outside the range extending from 0 to 1.

It may be determined, based on the wind turbine operation strategy, whether an optimization of the first active power reference P* and the first reactive power reference Q* has to be carried out. To determine whether an optimization of the first active power reference P* and the first reactive power reference Q* has to be carried out, lay be determined whether the current reference i*, when calculated based on the first active power reference P* and the first reactive power reference Q*, would cause the grid side converter to supply power to the grid having a current component which exceeds a grid side converter current limit $I_{lim}$.

To determine whether the current component would exceed the grid side converter current limit $I_{lim}$, a maximum current $(\hat{i}_a, \hat{i}_b, \hat{i}_c)$ that would result if the current reference was generated, may be calculated for each phase of the power line at 608. The calculation may be carried out based on at least the turbine operation strategy, the first active power reference P*, the first reactive power reference Q*, the positive sequence voltage $v^+$, the negative sequence voltage $v^-$, the first parameter $k_1$, the second parameter $k_2$, and the phase angle $\delta$.

To determine the maximum current for each phase, an active current ellipse defined by the first parameter $k_1$, the positive sequence voltage $v^+$, the negative sequence voltage $v^-$, and the first active power reference P* may be determined. A reactive current ellipse defined by the second parameter $k_2$, the positive sequence voltage $v^+$, the negative sequence voltage $v^-$, the in-quadrature positive, sequence voltage $v_\perp^+$, the in-quadrature negative sequence voltage $v_\perp^-$, and the first reactive power reference Q* gray also be determined. The active current ellipse and the reactive current ellipse may be added in order to obtain a combined current ellipse. The combined current ellipse may be rotated about the phase angle $\delta$. The maximum projections of the combined current ellipse onto the abc axes corresponding to a three phase system may be determined. Each projection on abc axes may corresponds to a maximum current $(\hat{i}_a, \hat{i}_b, \hat{i}_c)$ in the respective abc phases of the three phase system.

At 610, the maximum current $(\hat{i}_a, \hat{i}_b, \hat{i}_c)$ each phase is compared with the corresponding grid side converter phase current limit $I_{lim}$. If one of the maximum phase currents $(\hat{i}_a, \hat{i}_b, \hat{i}_c)$ does not exceed the corresponding grid side converter phase current limit $I_{lim}$, is determined that the current component does not exceed the grid side converter current limit $I_{lim}$. Thus, no optimization of the first active power reference P* and the first reactive power reference Q* has to be carried out. A second active power reference P and a second reactive power reference Q may be generated such that they are identical to the first active power reference P* and the first reactive power reference Q* respectively.

If one of the maximum phase currents $(\hat{i}_a, \hat{i}_b, \hat{i}_c)$ exceeds the grid side converter phase current limit $I_{lim}$, it is determined that the current component exceeds the grid side converter current limit $I_{lim}$. An optimization of the first active power reference P* and the first reactive power reference Q* has to be carried out. A second active power reference P and a second reactive power reference Q may be generated at 612. The second active power reference P and the second reactive power reference Q may be generated such that they differ from the first active power reference P* and the first reactive power reference Q*, respectively. The second active power reference P and the second reactive power reference Q may be generated such that the resulting current component of the supplied power remains below the grid side converter current limit $I_{lim}$.

In one embodiment, the second active power reference P and the second reactive power reference Q indicating an actual amount of active power and reactive power to be supplied by the grid side converter to the grid, respectively, may be determined depending on at least the first active power reference P*, the first reactive power reference Q* and the wind turbine operation strategy. In another embodiment, the second active power reference P and the second reactive power reference Q may be generated based on at least the wind turbine operation strategy, the first active power reference P* the first reactive power reference Q*, the first parameter $k_1$, the second parameter $k_2$, the positive sequence voltage $v^+$, the negative sequence voltage $v^-$ and the phase angle δ.

In one embodiment, to determine whether an optimization of the first active power reference P* and the first reactive power reference Q* has to be carried out, it may also be determined whether the second active power reference P and the second reactive power reference Q are to be generated in dependence on priority levels indicating whether regulating the active power or regulating the reactive power to corresponding power reference levels has higher priority. The second active power reference P and the second reactive power reference Q may be generated in dependence on the priority levels if the priority levels are to be considered.

It may be checked whether the second active power reference P falls within a predetermined active power range, or whether the second reactive power reference Q falls within a predetermined reactive power range. The second active power reference P or the second reactive power reference Q may be changed to fall within the predetermined power ranges when the second active power reference P and the second reactive power reference Q do not fall within the predetermined power ranges. The second active power reference P may be replaced by an upper limit value of the predetermined active power range if the second active power reference P exceeds the upper limit value, or the second active power reference P may be replaced by a lower limit value of the predetermined active power range if the second active power reference P falls below the lower limit value. The second reactive power reference Q may be replaced by an upper limit value of the predetermined reactive power range if the second reactive power reference Q exceeds the upper limit value, or the second reactive power reference Q may be replaced by a lower limit value of the predetermined reactive power range if the second reactive power reference Q falls below the lower limit value.

At 614, the current reference i* is generated based on at least the second active power reference P, the second reactive power reference Q, the positive sequence voltage $v^+$, the negative sequence voltage $v^-$, the first parameter $k_1$, and the second parameter $k_2$. Active and reactive power to the power line may be supplied, with the grid side converter, based on the current reference i*. At 616, the process for determining a current reference for a power converter of a wind turbine ends.

The current reference(s) i*, the positive sequence components and the negative sequence components are vector entities.

Details of the method for operating a wind turbine are described in the following.

Flexible Positive-Negative Sequence Control (FPNSC)

A method for adjusting, in a more flexible way, the relationship between the symmetrical components of the reference currents, giving rise to a more flexible strategy to calculate such references, namely the Flexible Positive-Negative Sequence Control (FPNSC) strategy is implemented.

An instantaneous conductance, g, can be divided into a positive-sequence and a negative-sequence conductance value, $G^+$ and $G^-$. Through this reasoning, the active reference current vector can be written as:

$$i_p^* = G^+ v^+ + G^- v^- \tag{1.1}$$

This active power current contains also a negative-sequence component. If just either positive- or negative-sequence currents had to be injected, the value of $G^+$ and $G^-$ would be found as:

$$G^+ = \frac{P}{|v^+|^2}; G^- = \frac{P}{|v^-|^2}, \tag{1.2}$$

respectively. However, if the current injected into the grid had to be composed by both sequence components simultaneously, it would be necessary to regulate the relationship between them in order to keep constant the amount of active power delivered to the grid. In order to do that, a scalar parameter, $k_1$, regulates the contribution of each sequence component on the active reference currents in the form:

$$i_p^* = k_1 \frac{P}{|v^+|^2} v^+ + (1 - k_1) \frac{P}{|v^-|^2} v^- \tag{1.3}$$

By means of regulating $k_1$ in (1.3) within the range from 0 to 1, it is possible to change the proportion in which the positive- and negative-sequence components of the active currents injected into the grid participle in delivering a given amount of active power P to the grid. For instance, by making $k_1=1$, balanced positive-sequence currents will be injected into the grid to deliver the active power P while by making $k_1=0$, perfectly balanced negative-sequence currents will be injected into the grid to deliver the active power P. In some special cases, $k_1$ might be out of the [0,1] range. In such cases, one of the sequence components of the injected currents would be draining active power from the grid, whereas the other sequence component would be delivering as much active power as necessary to balance the system and make the total active power delivered to the grid equal to P.

An analogous reasoning can be followed for finding the reference for reactive currents, which can be calculated as:

$$i_q^* = k_2 \frac{Q}{|v^+|^2} v_\perp^+ + (1 - k_2) \frac{Q}{|v^-|^2} v_\perp^-. \tag{1.4}$$

In this case, another scalar parameter, namely $k_2$, has been used to control of the proportion between the positive- and the negative-sequence components in the reference currents to inject a given reactive power Q into the grid, Finally, after arranging some terms, the reference currents provided to the current controller of the power converter can be found through the following expression:

$$i^* = P \cdot \left( \frac{k_1}{|v^+|^2} \cdot v^+ + \frac{(1-k_1)}{|v^-|^2} \cdot v^- \right) + Q \cdot \left( \frac{k_2}{|v^+|^2} \cdot v_\perp^+ + \frac{(1-k_2)}{|v^-|^2} \cdot v_\perp^- \right). \quad (1.5)$$

By means of changing the value of $k_1$ and $k_2$ in (1.5), the relationship between positive- and negative-sequence current components, in both, the active and the reactive currents can be easily modified. For instance, the positive-sequence voltage component at point of connection (PCC) of an inductive line will be boosted if some value of reactive current is injected making $k_2=1$, as just positive-sequence reactive currents are injected. On the other hand, the negative-sequence voltage component at such PCC will be reduced if 0, since just negative-sequence reactive currents are injected into the grid.

The performance of the instantaneous active power delivered to the grid when the FPNSC strategy is used to set the reference currents can be written as:

$$p = P + \tilde{p}, \quad (1.6)$$

where both power components are given by:

$$P = \frac{P \cdot k_1}{|v^+|^2} \cdot v^+ \cdot v^+ + \frac{P \cdot (1-k_1)}{|v^-|^2} \cdot v^- \cdot v^-, \quad (1.7)$$

$$\tilde{p} = \left( \frac{P \cdot k_1}{|v^+|^2} + \frac{P \cdot (1-k_1)}{|v^-|^2} \right) v^+ \cdot v^- + \left( \frac{Q \cdot k_2}{|v^+|^2} - \frac{Q \cdot (1-k_2)}{|v^-|^2} \right) v_\perp^+ \cdot v^-. \quad (1.8)$$

Similar conclusions can be found for the instantaneous reactive power components.

If the active power reference, P, is not null, the only way to cancel out the first term of the power oscillation $\tilde{p}$ in (1.8) is to make $k_1$ higher than 1, as shown the following expression:

$$\frac{-P \cdot k_1}{|v^+|^2} = \frac{P \cdot (1-k_1)}{|v^-|^2} \Rightarrow k_1 = \frac{|v^+|^2}{|v^+|^2 - |v^-|^2} \geq 1. \quad (1.9)$$

However, for any reactive power reference, Q, the cancellation of the second power oscillation $\tilde{p}$ term in (1.8) is feasible by setting a value for $k_2$ within the range [0,1], that is:

$$\frac{Q \cdot k_2}{|v^+|^2} = \frac{Q \cdot (1-k_2)}{|v^-|^2} \Rightarrow k_2 = \frac{|v^+|^2}{|v^+|^2 + |v^-|^2} \leq 1. \quad (1.10)$$

Not all the power oscillations might be eliminated because of some specific restriction set on the range of values for $k_1$ and $k_2$. That is, if the range of values for $k_1$ and $k_2$ is restricted to a predetermined range of values (like a range between 0 and 1), not all possible oscillations may be cancelled out since, for particular oscillations, it may be necessary to use values for $k_1$ and $k_2$ outside of the predetermined range of values. Thus, the power oscillation can be reduced to an extent which is enabled by the range of $k_1$ and $k_2$. By means of using (1.9) and (1.10), the FPNSC strategy would behave as the PNSC (positive-negative sequence control) strategy.

Flexible Power Control with Current Limitation

Several strategies conduct to the injection of unbalanced currents through the power converter. As a consequence, the instantaneous value of these currents may be different from phase to phase in some cases. Under such conditions, an accurate control of the power converter is necessary in order to avoid an undesired trip, since an overcurrent in any of the phases of the power converter usually results in disconnection of the turbine from the grid.

Therefore, controlling the performance of the currents injected into the grid is a mandatory issue that should be considered when designing control strategies for grid-connected power converters operating under unbalanced grid voltage or grid fault conditions. Controlling the power converter in such a way that any phase current never exceeds a given instantaneous admissible limit has the following advantages/is combinable with the following implementations:
- achieving fault ride through capabilities under unbalanced grid faults,
- protecting the integrity of the power converter (avoiding damages to the converter),
- maximizing the P and Q injection according to the converter
- participating in the mitigation of the grid voltage unbalance.
- Reducing the ripples in active or reactive power
- Reducing the DC-link voltage ripple Nevertheless, the relationship between the power delivered by the converter and the associated currents depends strongly on the selected power strategy. Hence, there is not a standard expression for calculating the maximum value of the currents for all the power control strategies discussed previously. Depending on the intended objective the cancellation of active power oscillations, the cancellation of both, active and reactive power oscillations or the reduction of harmonic currents injection, the expression for finding the maximum peak value in the phase currents will be different.

A method for determining the maximum peak value of the currents injected by power converter into the phases of the three-phase system, as well as the maximum active and reactive power setpoints that give rise to such currents, will be presented for the FPNSC strategy.

Locus of the Current Vector Under Unbalanced Grid Conditions

Considering the definition of the FPNSC given above, the reference current obtained with strategy can be split into an active current term, $i_p^*$, and a reactive current term, $i_q^*$, as follows:

$$i^* = \underbrace{P \cdot \left( \frac{k_1}{|v^+|^2} \cdot v^+ + \frac{(1-k_1)}{|v^-|^2} \cdot v^- \right)}_{i_p^*} + \underbrace{Q \cdot \left( \frac{k_2}{|v^+|^2} \cdot v_\perp^+ + \frac{(1-k_2)}{|v^-|^2} \cdot v_\perp^- \right)}_{i_q^*}. \quad (1.11)$$

This is a general equation. If there are no restrictions, P and Q can take any value. However, in an embodiment, the current reference controlling unit 208 is represented by equation (1.11) with the terms P and Q representing the second active power reference P and the second reactive power reference Q respectively. In the event that the second active power reference P the second reactive power reference Q are the same as the first active power reference P* and the first reactive power reference Q*, the terms P and Q may represent the first active power reference P* and the first reactive power reference Q* respectively.

Considering the injection of a certain value of P and Q under steady-state grid voltage unbalanced conditions, with a fixed set of parameters $k_1$ and $k_2$, the instantaneous values of $v^+$, $v^-$, $v_\perp^+$, $v_\perp^-$ in (1.11) are multiplied by constant factors, namely $C_1$, $C_2$, $C_3$ and $C_4$, to simplify formulation, that is:

$$i^* = \underbrace{C_1 \cdot v^+ + C_2 \cdot v^-}_{i_p^*} + \underbrace{C_3 \cdot v_\perp^+ + C_4 \cdot v_\perp^-}_{i_q^*}, \quad (1.12)$$

where:

$$C_1 = \frac{P \cdot k_1}{|v^+|^2}; \quad C_2 = \frac{P \cdot (1-k_1)}{|v^-|^2}; \quad (1.13)$$

$$C_3 = \frac{Q \cdot k_2}{|v^+|^2}; \quad C_4 = \frac{Q \cdot (1-k_2)}{|v^-|^2}.$$

As the equations that permit calculating $i_p^*$ and $i_q^*$ have been developed considering a stationary αβ reference frame. The addition of a positive-sequence voltage vector, $v^+$, and a negative-sequence voltage vector, $v^-$, results in a ellipse in the αβ domain. Therefore, the addition of $C_1 \times v^+$ and $C_2 \times v^-$, will give rise as well to an ellipse for $i_p^*$. Likewise, the same can be concluded for $C_3 \times v_\perp^+$ and $C_4 \times v_\perp^-$, that will generate the $i_q^*$ ellipse. An example of the graphical locus for both, $i_p^*$ and $i_q^*$, have been depicted in FIGS. 7a and 7b for a generic case.

Figure 7A:
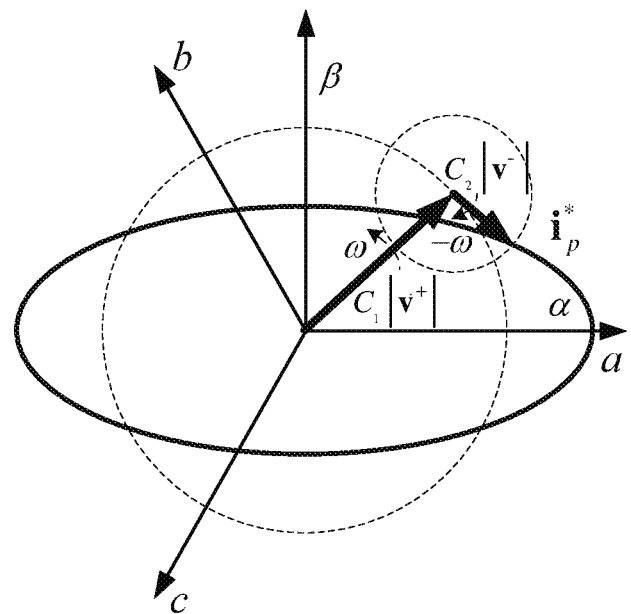
FIGS. 7a and 7b show respective locus of an active current ellipse and a reactive current ellipse according to an embodiment of the present invention.
Figure 7B:
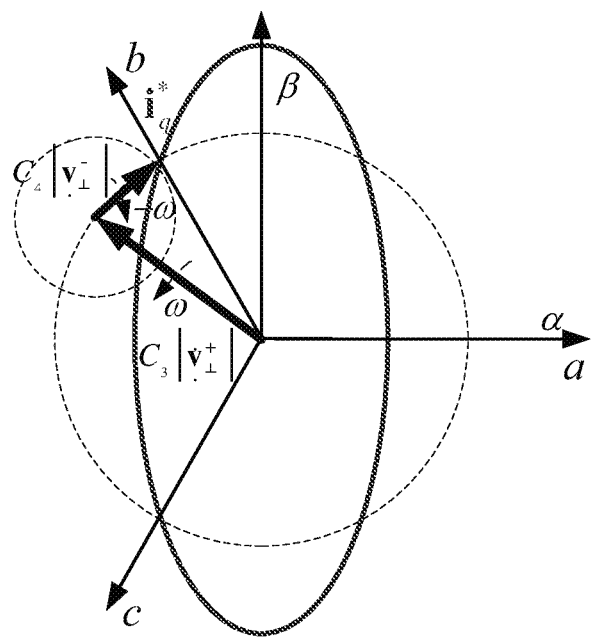

As it can be concluded from FIG. 7a, the active current ellipse will be aligned with the locus of v. The values of the constant terms $C_1$ and $C_2$ will just scale it. Likewise, the same can be concluded for the reactive current ellipse in FIG. 7b, which is 90° shifted and aligned with the in-quadrature components of the voltage $v_\perp$.

Figure 8:
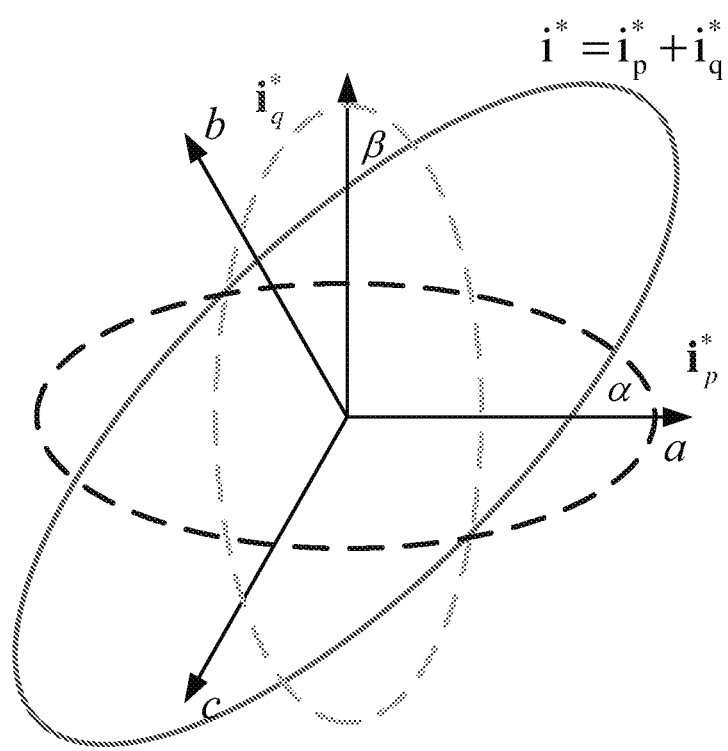
FIG. 8 shows a locus of a combined current ellipse obtained from adding an active current ellipse and a reactive current ellipse according to an embodiment of the present invention.

Once the locus of $i_p^*$ and $i_q^*$ have been depicted, their addition will permit obtaining the locus of i*, as shown in FIG. 8.

For the sake of clarity and simplicity, the influence of the positive and negative sequence phase of the voltage, $\phi^+$ and $\phi^-$, were not considered in the current locus description. However, both angles have a significant influence on the evolution of i*. If $\phi^+=\phi^-$ the αβ representation of $i_p^*$ is an ellipse whose focus are aligned with the α axis, while $i_q^*$ results on an orthogonal ellipse centered on the β axis. On the other hand, if $\phi^+\neq\phi^-$, ($\phi^+$ being the initial positive sequence phase angle of the voltage, $\phi^-$ being the initial negative sequence phase angle of the voltage), the main ellipses $i_p^*$ and $i_q^*$ are not aligned with the αβ axis, but shifted a certain angle, δ. This angle can be calculated as the difference between the absolute value of the positive and negative phase-angles divided by two, that is:

$$\delta = \frac{|\phi^+|-|\phi^-|}{2}. \quad (1.14)$$

Figure 9:
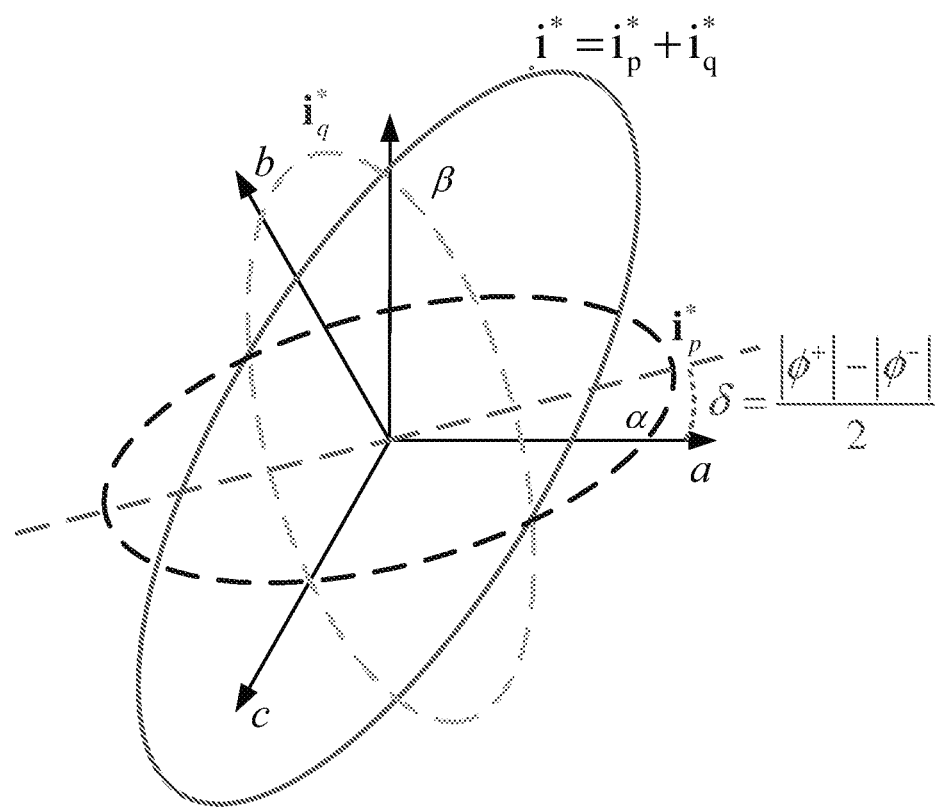
FIG. 9 shows respective locus of an active current ellipse, a reactive current ellipse and a combined current ellipse obtained from adding an active current ellipse and a reactive current ellipse after rotation about a phase angle according to an embodiment of the present invention.

In FIG. 9, the shape of the evolution of i*, $i_p^*$ and $i_q^*$ are displayed considering and $\phi^-=0$. In (1.14), the denominator value could be equal to or substantially close to 2.

Instantaneous Value of the Three Phase Currents

The analysis performed above, regarding the evolution of the current vector on the αβ reference frame, is useful to find an expression that permits determining the instantaneous value of its αβ components. However, it is first necessary to introduce some changes in their current formulation.

Figure 10A:
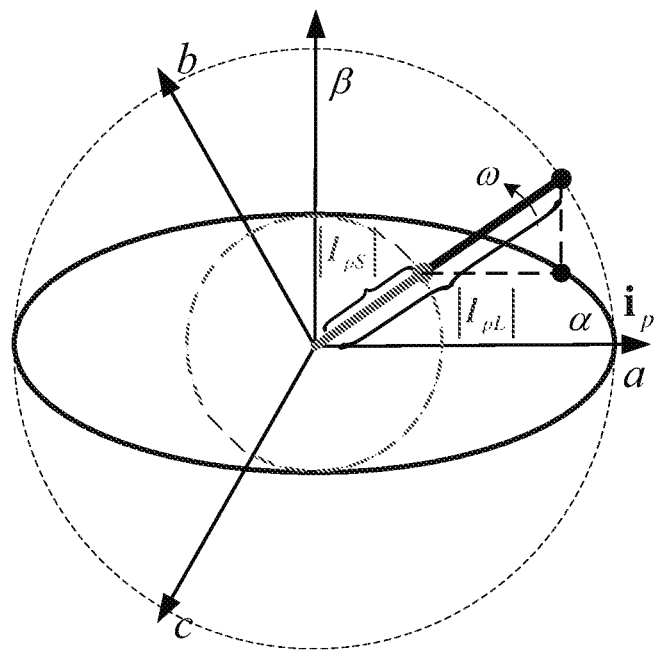
FIG. 10a shows a graphical representation of $\alpha\beta$ components of an active current ellipse according to an embodiment of the present invention.

The active current ellipse, shown in FIG. 7a, can be mathematically defined on the αβ coordinates as:

$$i_p^* = \begin{bmatrix} i_{p\alpha}^* \\ i_{p\beta}^* \end{bmatrix} = \begin{bmatrix} I_{pL} \cdot \cos\omega t \\ I_{pS} \cdot \sin\omega t \end{bmatrix}, \quad (1.15)$$

where $I_{pL}$ and $I_{pS}$ are the modulus of two rotating vectors, being $I_{pL}$ equal to the value of the large axis of the $i_p^*$ ellipse, while $I_{pS}$ is the magnitude of its short axis. As written in (1.15), the αβ components of the ellipse can be found as the horizontal and vertical projection of the large and short vectors, respectively, for each value of the angle ωt. The graphical representation of this concept is depicted in FIG. 10a.

The value of both vectors, $I_{pL}$ and $I_{pS}$, can be found through the equations (1.16) and (1.17) as follows:

$$I_{pL} = P \cdot \left( \frac{k_1}{|v^+|} + \frac{(1-k_1)}{|v^-|} \right) \quad (1.16)$$

$$I_{pS} = P \cdot \left( \frac{k_1}{|v^+|} - \frac{(1-k_1)}{|v^-|} \right) \quad (1.17)$$

Following the same reasoning, the reactive current ellipse can be also expressed in this alternative way. However, in this case it must be taken into account that origin of the angle, ωt, is aligned with the β axis. Hence, the components in the αβ axis for $i_q^*$ can be written as:

$$i_q^* = \begin{bmatrix} i_{q\alpha}^* \\ i_{q\beta}^* \end{bmatrix} = \begin{bmatrix} -I_{qS} \cdot \sin\omega t \\ I_{qL} \cdot \cos\omega t \end{bmatrix} \quad (1.18)$$

Figure 10B:
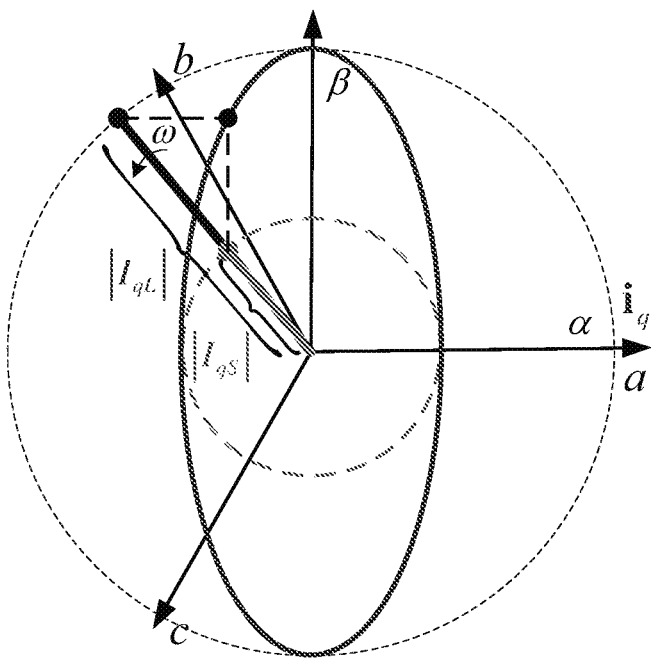
FIG. 10b shows a graphical representation of $\alpha\beta$ components of a reactive current ellipse according to an embodiment of the present invention.

The resulting reactive current ellipse when applying (1.18) is depicted in FIG. 10b. In this case, the value of the long and short axis of the ellipse can be found as:

$$I_{qL} = Q \cdot \left( \frac{k_2}{|v^+|} + \frac{(1-k_2)}{|v^-|} \right) \quad (1.19)$$

$$I_{qS} = Q \cdot \left( \frac{k_2}{|v^+|} - \frac{(1-k_2)}{|v^-|} \right) \quad (1.20)$$

Finally, the instantaneous αβ components of the reference current vector i*, which considers the effect of both the active and the reactive currents, can be found by means of adding (1.15) to (1.18), which results in the expression (1.21).

$$i^* = i_p^* + i_q^* = \begin{bmatrix} i_\alpha^* \\ i_\beta^* \end{bmatrix} = \begin{bmatrix} I_{pL} \cdot \cos\omega t - I_{qS} \cdot \sin\omega t \\ I_{pS} \cdot \sin\omega t + I_{qL} \cdot \cos\omega t \end{bmatrix} \quad (1.21)$$

The αβ components in equation (1.21) can be rewritten and simplified as shown in (1.22) and (1.23).

$$i_\alpha^* = k_\alpha \cdot \cos(\omega t + \theta_\alpha); \; k_\alpha = \sqrt{I_{pL}^2 + I_{qS}^2}\;; \; \theta_\alpha = \tan^{-1}\left(\frac{I_{qS}}{I_{pL}}\right) \quad (1.22)$$

$$i_\beta^* = k_\beta \cdot \sin(\omega t + \theta_\beta); \; k_\beta = \sqrt{I_{qL}^2 + I_{pS}^2}\;; \; \theta_\beta = \tan^{-1}\left(\frac{I_{qL}}{I_{pS}}\right) \quad (1.23)$$

By means of these last expressions, the instantaneous values of the three-phase currents to be injected into the grid by the power converter, expressed on the αβ reference frame, can be found.

Estimation of the Maximum Current in Each Phase

Once the expressions to determine the instantaneous evolution of the currents on the αβ reference frame have been found, the next step is to determine the value of the peak current at each phase, in order to find out which phase will be limiting the injection of power into the network as a function of the specific unbalanced grid conditions. Moreover, the main purpose of the study is not just to estimate the value of the peak currents injected in the three phases of the grid, but also to deduct an expression that allows setting the active and reactive powers setpoints considering the ratings of the power converter, the grid conditions and the control parameters.

Figure 11:
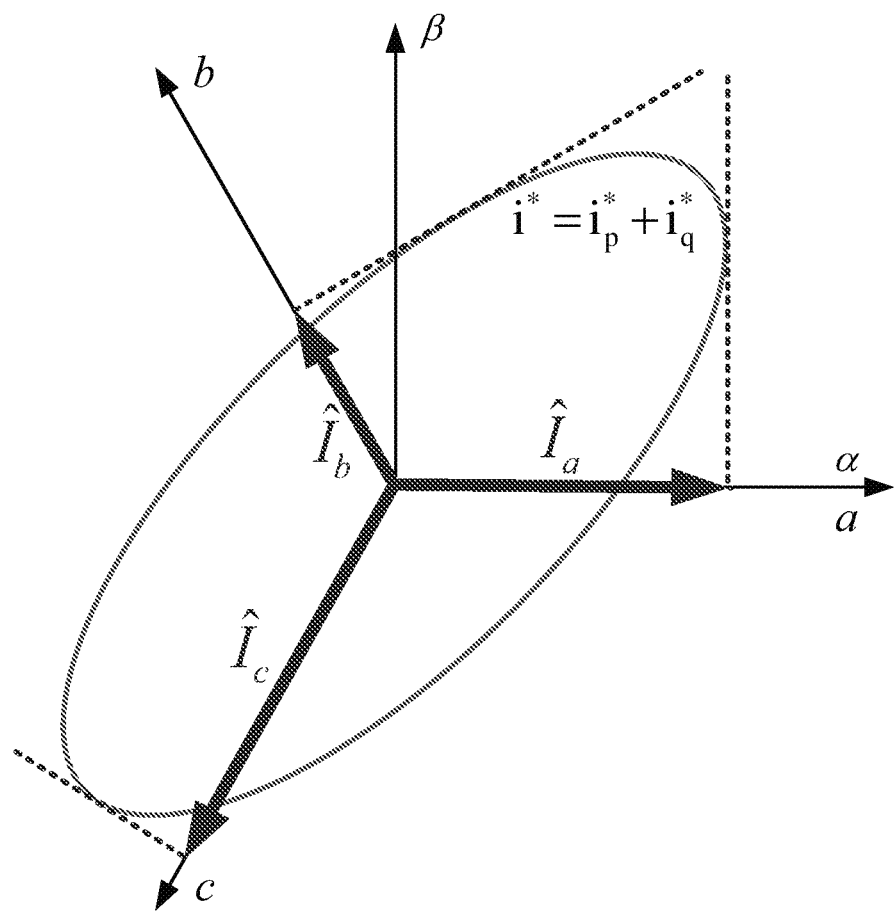
FIG. 11 shows a graphical representation of maximum current at each phase of a three phase system according to an embodiment of the present invention.

As it was shown in FIG. 11, the reference for the current vector resulting from the FPNSC strategy, i*, describes an ellipse in the αβ reference frame. Taking advantage of this representation, the maximum current at each phase of the three phase system $\hat{I}_a$, $\hat{I}_b$ and $\hat{I}_c$ can be calculated by finding the maximum projection of the current ellipse on the abc axis, as graphically shown in FIG. 11.

Considering that the phase 'a' of the system is aligned with the α axis, the peak value of the current in this phase, $\hat{I}_a$, is equal to the maximum value of the $i_\alpha^*$ component. Considering the expression written in (1.22), which permits finding the instantaneous value of $i_\alpha^*$, it can be concluded that the maximum value of this component arises when the trigonometric term is equal to one. Therefore, the maximum value of $i_\alpha^*$ can be found as:

$$\hat{I}_\alpha = \sqrt{I_{pL}^2 + I_{qS}^2} \cdot \underbrace{\cos\left(\omega t + \tan^{-1}\left(\frac{I_{qS}}{I_{pL}}\right)\right)}_{1} \Rightarrow \hat{I}_\alpha = \sqrt{I_{pL}^2 + I_{qS}^2}. \quad (1.24)$$

and hence, as stated previously, $\hat{I}_\alpha = \hat{I}_a$.

The same method can be used as well for finding $\hat{I}_b$ and $\hat{I}_c$. Nevertheless, both in the abc reference frame depend upon α and β components, hence determining their value is not so straightforward. However, if the resulting ellipse of FIG. 11 is rotated in such a way that the expressions giving $\hat{I}_b$ and $\hat{I}_c$ have only a single component on the a axis, the expression as for finding $\hat{I}_a$ could be as well applied to determine the values of $\hat{I}_b$ and $\hat{I}_c$. Thus, the maximum for $\hat{I}_b$ can be found by leading the original ellipse π/3 rad. Under these conditions, the maximum value in the a axis is equal to $\hat{I}_b$. Likewise, $\hat{I}_c$ can be found in an analogous way, but lagging the ellipse -π/3 rad.

The mechanism for rotating the ellipse in the αβ reference frame can be made by using the rotation matrix shown in (1.25). In this equation, γ is the angle to be rotated, while the new components of the rotated ellipse are $i_\alpha^{*'}$ and $i_\beta^{*'}$.

$$i^{*'} = \begin{bmatrix} i_\alpha^{*'} \\ i_\beta^{*'} \end{bmatrix} = \begin{bmatrix} \cos\gamma & -\sin\gamma \\ \sin\gamma & \cos\gamma \end{bmatrix} \cdot \begin{bmatrix} k_\alpha \cdot \cos(\omega t + \theta_\alpha) \\ k_\beta \cdot \sin(\omega t + \theta_\beta) \end{bmatrix} \quad (1.25)$$

The value of γ is different depending on the phase a, b or c. Considering the general case, where $\phi^+ \neq \phi^-$ as in FIG. 9, γ is equal to δ for the phase 'a', while for phases 'b' and 'c' an additional π/3 and -π/3 angle should be added, respectively. In a nutshell, the corresponding γ angle for each phase is:

$$\hat{I}_a = \hat{I}'_\alpha(\gamma = \delta),$$
$$\hat{I}_b = \hat{I}'_\alpha(\gamma = \delta + \pi/3), \quad (1.26)$$
$$\hat{I}_c = \hat{I}'_\alpha(\gamma = \delta - \pi/3).$$

where δ is the angle defined by (1.14). Once the ellipse is properly rotated, only the maximum value of the current on the α axis results of interest, as the maximum on this axis is equal to the peak value of the phase current. For this reason only this component will be studied in the following. By means of expanding (1.25), $i_\alpha^{*'}$ can be rewritten as:

$$i_\alpha^{*'} = k_\alpha \cdot \cos\gamma \cdot (\cos\omega t \cdot \cos\theta_\alpha - \sin\omega t \cdot \sin\theta_\alpha) - \quad (1.27)$$
$$k_\beta \cdot \sin\gamma \cdot (\sin\omega t \cdot \cos\theta_\beta + \cos\omega t \cdot \sin\theta_\beta).$$

Regrouping (1.27) as sine and cosine terms, the following expression can be found:

$$i_\alpha^{*'} = A_1 \cos\omega t + B_1 \sin\omega t, \quad (1.28)$$

where:

$$A_1 = (k_\alpha \cdot \cos\gamma \cdot \cos\theta_\alpha - k_\beta \cdot \sin\gamma \cdot \sin\theta_\beta)$$

$$B_1 = (-k_\alpha \cdot \cos\gamma \cdot \sin\theta_\alpha - k_\beta \cdot \sin\gamma \cdot \cos\theta_\beta). \quad (1.29)$$

Moreover, the values of $A_1$ and $B_1$ can be further simplified, obtaining:

$$A_1 = I_{pL} \cdot \cos\gamma - I_{qL} \cdot \sin\gamma$$

$$B_1 = -I_{qS} \cdot \cos\gamma - I_{pS} \cdot \sin\gamma \quad (1.30)$$

where the values $I_{pL}$, $I_{pS}$, $I_{qL}$, and $I_{qS}$ are detailed in (1.16), (1.17), (1.19) and (1.20).

Finally the maximum value on the a axis of (1.28) can be written as:

$$\hat{I}_\alpha' = \sqrt{A_1^2 + B_1^2} \quad (1.31)$$

As a conclusion of the study carried out until this point, the value of the peak currents injected in each phase, for given grid voltage and power conditions, can be determined by using the expressions shown in the table 1200 shown in FIG. 12.

According to the equation (1.31) the square value of the maximum current, $\hat{I}_\alpha'$, of each phase is equal to:

$$(\hat{I}_\alpha')^2 = A_1^2 + B_1^2. \quad (1.32)$$

By writing $\hat{I}_\alpha'$ as simply $\hat{I}$, denoting the maximum current admissible by the power converter, and expanding (1.32) the following expression can be written:

$$\hat{I}^2 = \quad (1.33)$$
$$P^2 \cdot \left[\frac{k_1^2 \cdot |v^-|^2 + (1-k_1)^2 \cdot |v^+|^2 + 2k_1(1-k_1)\cos 2\gamma \cdot |v^+| \cdot |v^-|}{|v^+|^2 \cdot |v^-|^2}\right] +$$
$$Q^2 \cdot \left[\frac{k_2^2 \cdot |v^-|^2 + (1-k_2)^2 \cdot |v^+|^2 - 2k_2(1-k_2)\cos 2\gamma \cdot |v^+| \cdot |v^-|}{|v^+|^2 \cdot |v^-|^2}\right] -$$
$$PQ \cdot \left[\frac{(2k_1 + 2k_2 - 4k_1k_2) \cdot |v^+| \cdot |v^-| \cdot \sin 2\gamma}{|v^+|^2 \cdot |v^-|^2}\right].$$

The peak current for each phase, given by $\hat{I}$, can take three values, one for each phase, matching the three possible values of the angle γ according to (1.26).

The equation shown in (1.33) is a key expression, as it permits estimating the maximum value of the current that will arise at each phase under given grid conditions, active and reactive powers references and control parameters selection, when implementing the FPNSC strategy. As it will be shown in the following, this expression also allows determining the maximum active and reactive powers that can be delivered to grid by the power converter, under generic grid voltage conditions, without reaching the maximum admissible current in any of its phases.

Estimation of the Maximum Active and Reactive Power Setpoint

The equations of the FPNSC current strategy have been presented above. Moreover, the analytical relationship between the maximum current, the grid voltage components and the control parameters have been determined. Hence, now it is possible to easily estimate the maximum phase currents that will be obtained in the three phases of the power converter under different operating conditions.

In wind turbines, a high level control layer is normally the responsible of setting the reference for the active and reactive powers to be delivered by the power converter. Therefore, it is very important to find an expression that allows setting the maximum active and reactive power setpoints that can be provided by the power converter, without exceeding its nominal current ratings, when it works under unbalanced grid voltage or grid fault conditions.

In the following two cases will be studied:
  i) Simultaneous active and reactive power delivery. The power converter should deliver a given amount of active power and maximize the injection of reactive power, and vice versa.
  ii) Injection of maximum reactive power. The power converter should inject the maximum amount of reactive power to boost the voltage at the PCC under unbalanced grid voltage conditions.

Simultaneous Active and Reactive Power Delivery

The equation (1.34) can be found by operating the expression shown in (1.33). This expression allows maximizing the power developed by a power converter, which should deliver both active and reactive powers, being one of these two power magnitudes given as a reference and having to calculate the maximum magnitude for the other power term, without overpassing in any of the phases the maximum instantaneous current that can be drawn by the power converter $$0 = Q^2 \cdot [k_2^2 \cdot |v^-|^2 + (1-k_2)^2 \cdot |v^+|^2 - 2k_2(1-k_2)\cos 2\gamma \cdot |v^+| \cdot |v^-|] - \quad (1.34)$$
$$PQ \cdot [(2k_1 + 2k_2 - 4k_1 k_2) \cdot |v^+| \cdot |v^-| \cdot \sin 2\gamma] +$$
$$P^2 \cdot [k_1^2 \cdot |v^-|^2 + (1-k_1)^2 \cdot |v^+|^2 + 2k_1(1-k_1)\cos 2\gamma \cdot |v^+| \cdot |v^-|] -$$
$$\hat{I}^2 \cdot |v^+|^2 \cdot |v^-|^2$$

As an example, when the active power to be delivered is set to P*, the reactive power can be found by solving the following equation:

$$0 = Q^2 \cdot \underbrace{[k_2^2 \cdot |v^-|^2 + (1-k_2)^2 \cdot |v^+|^2 - 2k_2(1-k_2)\cos 2\gamma \cdot |v^+| \cdot |v^-|]}_{a} - \quad (1.35)$$
$$Q \cdot P^* \underbrace{[(2k_1 + 2k_2 - 4k_1 k_2) \cdot |v^+| \cdot |v^-| \cdot \sin 2\gamma]}_{b} +$$
$$\underbrace{P^{*2} \cdot [k_1^2 \cdot |v^-|^2 + (1-k_1)^2 \cdot |v^+|^2 + 2k_1(1-k_1)\cos 2\gamma \cdot |v^+| \cdot |v^-|] - \hat{I}^2 \cdot |v^+|^2 \cdot |v^-|^2}_{c}$$

$$0 = aQ^2 + bQ + c \quad (1.36)$$

The resolution of this system gives rise to three possible solutions, since the angle γ can take three different values as indicated in the table 1200 of FIG. 12. Between these three values the minimum one should be selected in order to give the final setpoint for the power converter, i.e., P=P* and Q=Q$_{min}$(Î,P*).

In an analogous way, the same reasoning can be followed when the reactive power setpoint is given as a reference and the maximum active power to be delivered should be calculated, without triggering the overcurrent protection in any of the phases.

Injection of Maximum Reactive Power

In this case, the objective is to inject into the grid the highest amount of Q, while setting the active power reference equal to zero, without exceeding the maximum current admitted by the power converter in any of the phases. Considering these constrains and operating (1.33), the expression (1.37) can be found, which allows calculating the maximum value for the reactive power to be injected, Q, as a function of the sequence components of the grid voltage, the control parameters, and the limit current in any of the phases of the power converter.

$$Q = \sqrt{\frac{\hat{I}^2 \cdot |v^+|^2 \cdot |v^-|^2}{k_2^2 \cdot |v^-|^2 + (1-k_2)^2 \cdot |v^+|^2 - 2k_2(1-k_2)\cos 2\gamma \cdot |v^+| \cdot |v^-|}} \quad (1.37)$$

The value of Î in (1.37) can be changed according to the capability of the converter to withstand transient overcurrents.

Considering that γ can take three possible values, as shown in the table 1200 of FIG. 12, the expressions (1.37) will give rise to three different values for Q. Therefore, the final setpoint for reactive power should be the minimum of the three possible values obtained by operating (1.37). This minimum value will limit the maximum reactive power injected by the power converter, as over this value of one phase currents will trigger the overcurrent protection.

Performance of the FPNSC

Figure 13:
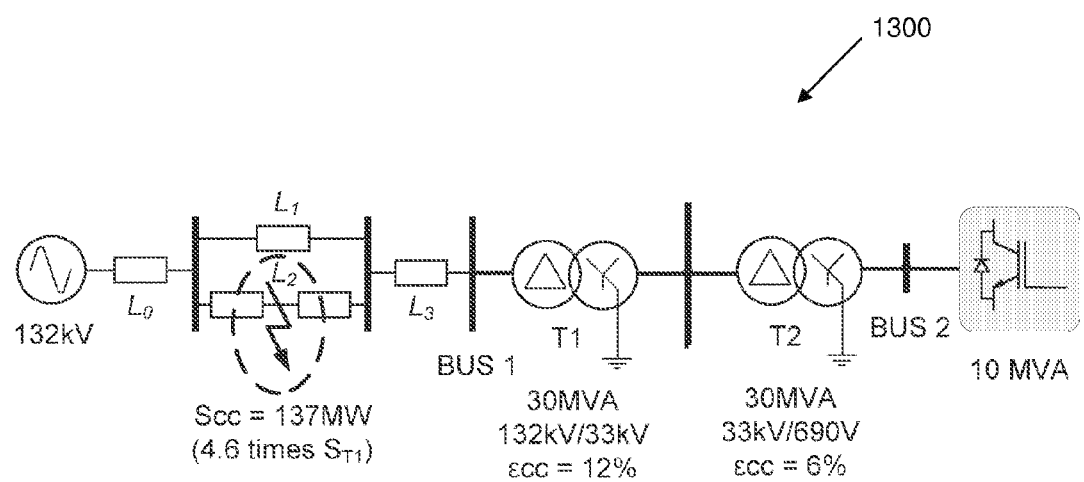
FIG. 13 shows a schematic drawing of an electrical network of a wind turbine usable with a system according to an embodiment of the present invention.

Evaluation of the performance of the FPNSC strategy to generate the reference currents for the power converters in a small power plant is described in the following. In this simulation, the power plant has been modelled by using an aggregated model of its generators. Therefore, the whole power plant has been modelled as a 10 MVA power converter connected to the grid. An exemplary electrical network 1300 considered herein is shown in FIG. 13.

In this network 1300, the unbalanced voltage at the PCC of the power converter arises due to the occurrence of a phase to ground fault at the overhead line L$_2$. After passing through 2 transformers, this kind of single-phase fault becomes a type D voltage sag at BUS 2 (a detailed explanation of different fault types is given in reference "Different methods for classification of three-phase unbalanced voltage dips due to faults", M. H. J. Bollen, L. D. Zhang, Electric Power Systems Research 66 (2003) 59-69).

The 10 MVA power converter will inject only reactive power into the network during the fault. The FPNSC strategy allows adjusting the values of the $k_1$ and $k_2$ parameters to set the ratio between the positive- and negative-sequence currents given values of active and reactive powers are delivered to the grid. However, the parameter $k_1$ can be discarded since it just affects to the active currents, which are considered equal to zero in this application, since just reactive currents should be injected into the grid.

The value of $k_2$ plays an important role, as it permits setting the performance, in term of sequence components, of the reactive currents injected into the grid. Although the parameter $k_2$ can take different values, just three cases in the range of [0,1] will be considered in this study case:

Case A: Injection of positive sequence reactive power ($k_2=1$)
Grid voltage support
Case B: Injection of negative sequence reactive power ($k_2=0$)
Grid voltage unbalance compensation
Case C: Injection of simultaneous of positive and negative sequence reactive power ($0<k_2<1$)
Cancellation of active power oscillations In addition to the implementation of these three strategies for generating the reference currents in the system of FIG. 13, the control algorithm also contains the equations for limiting the maximum reactive power to be injected by the power converter in order to do not trip the overcurrent protection in any of the phases.

Figure 14:
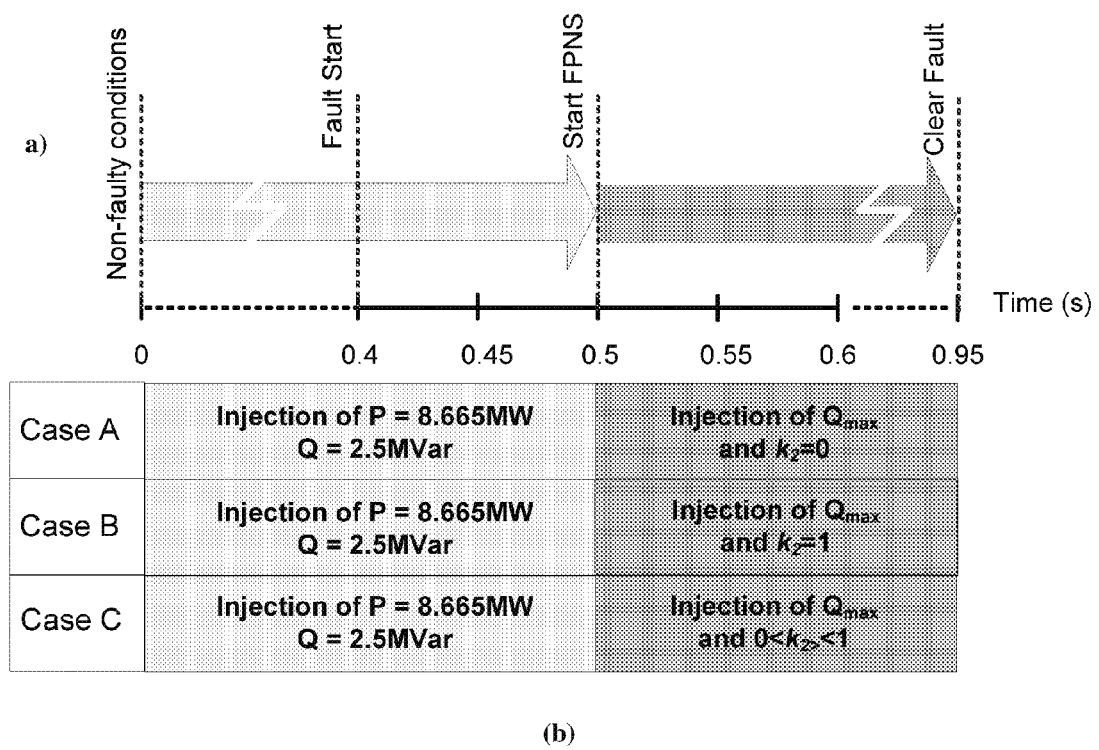
FIG. 14a shows a timing diagram of a sequence of events occurred during an operation of a wind turbine according to an embodiment of the present invention.
FIG. 14b shows an operation of a power converter corresponding to events occurred during an operation of a wind turbine according to an embodiment of the present invention.

However, in order to make visible the influence of the FPNSC strategy, a particular sequence will be applied to control the power converter in all the cases. FIG. 14a shows a diagram with the time sequence of the events considered, and FIG. 14b shows the operation of the power converter in each period.

According to FIGS. 14a and 14b, the power converter is injecting a certain amount of active and reactive powers into the network at t=0. After 400 ms, the unbalanced fault occurs. However the control mode of the converter does not change until t=500 ms, where the FPNSC is applied.

It should be pointed out that the following simulation results have been obtained working with a realistic weak grid model, with a shortcircuit ratio in the range of 4.5 and 5. Therefore, the appearance of the fault will give rise not only to unbalanced voltage components, but also to transient oscillations in the voltage, which are produced mainly by the dynamical response of the transformers belonging to the network. Regarding the operation of the power converter, it should be mentioned that a current control structure based on resonant controllers has been implemented, but other implementations are applicable.

Case A: Injection of Positive Sequence Reactive Power
In the first simulation test, case A, the FPNSC is controlled in order to inject the highest positive-sequence reactive current that the power converter is able to deliver. The plot of FIG. 15(a) shows the value of the grid voltage at BUS 1. On the other hand, the plot of FIG. 15(b) shows the performance of the grid voltage at the output of the power converter, BUS 2, which is divided into its positive- and negative-sequence at the plot of FIG. 15(c). The instantaneous active and reactive powers delivered to the grid are shown in the plot of FIG. 15(d). Finally the currents injected by the converter are shown in the plot of FIG. 15(e). In this last plot, the two black dashed lines represent the maximum current that can be injected by ire converter considering its nominal ratings.

Figure 15:
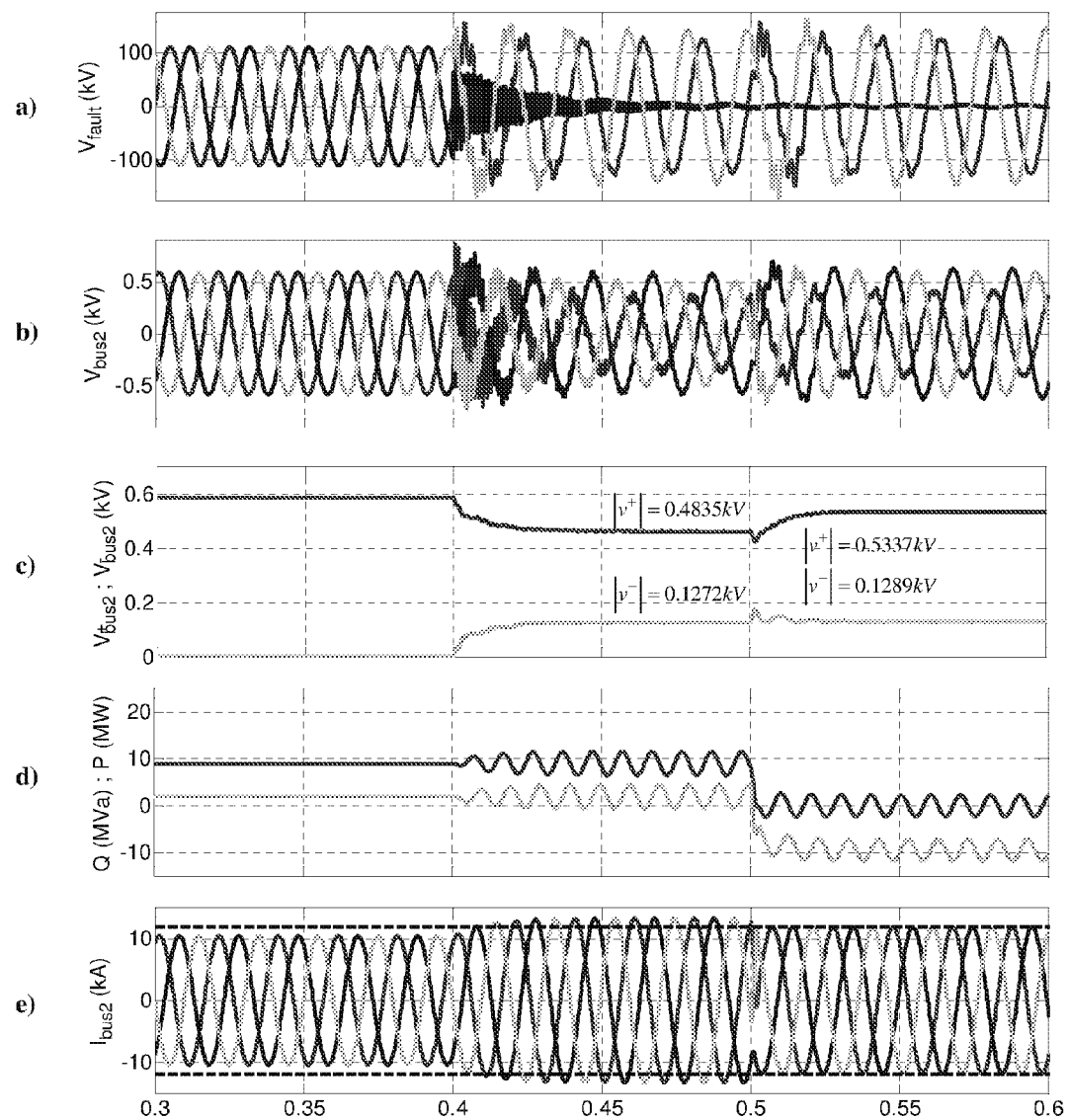
FIG. 15 shows graphical plots of signals measured over time during injection of positive sequence reactive power according to an embodiment of the present invention.

The analysis of FIG. 15 evidences how the full injection of positive-sequence reactive current during the fault permits boosting the voltage at the point of connection of the power converter, supporting hence the grid. As it is shown in the plot of FIG. 15(c), the positive-sequence voltage at BUS 2 increases from 0.4835 kV to 0.5337 kV. On the other hand, the negative sequence is not affected, as no negative-sequence reactive current is injected in this case.

The plot of FIG. 15(d) shows the oscillations in the active and reactive powers, which is produced by the interaction between the positive-sequence currents and the negative-sequence voltages that exist in the grid during the unbalanced voltage sag.

One of the most relevant conclusions that can be obtained is reflected in the plot of FIG. 15(e). At t=400 ms, the voltage sag occurs but the FPNSC together with the embedded current limitation algorithm is not still enabled. At this time, the reference currents are generated by a control algorithm that is focused in generating a set of positive-sequence reference currents to maintain the prefault power delivery. Since the amplitude of the grid voltage decreased during the grid fault, the reference currents provided to the current controller by such algorithm overpasses the limit value. At t=500 ms, the FPNSC together with the embedded current limitation algorithm are activated, which makes the currents remain below the maximum admissible value, while the maximum reactive power is injected into the grid.

Figure 16:
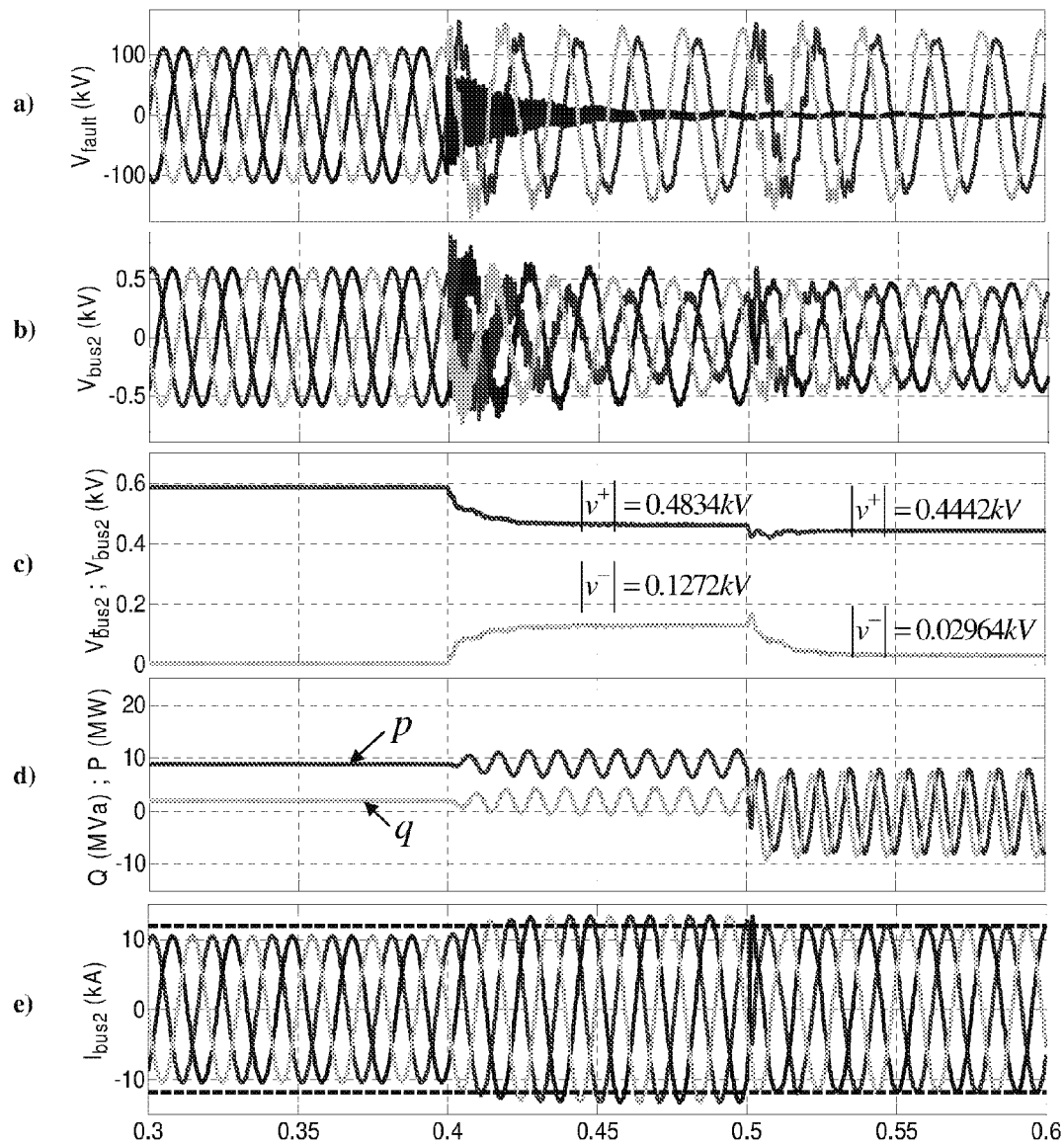
FIG. 16 shows graphical plots of signals measured over time during injection of negative sequence reactive power according to an embodiment of the present invention.

Case B: Injection of Negative Sequence Reactive Power
In the second experiment, case B, the injection of only negative-sequence reactive current has been considered ($k_2=0$). The performance of the different electrical variables in this case is shown in FIG. 16. As described above for Case A, between t=0 s and t=500 ms, the control strategy that operates the power converter is focused on delivering a certain active and reactive power setpoint by injecting positive-sequence currents. After that, the FPNSC is enabled at t=500 ms.

In this case, due to the injection of balanced negative-sequence currents, the voltage at BUS 2 becomes almost balanced. This effect can be clearly noticed in the voltage waveforms shown in the plot of FIG. 16(b). This improvement in the voltage balance is due to the reduction of the negative-sequence voltage at BUS 2. However, this feature is even more noticeable in the plot of FIG. 16(c), where it can be appreciated how the value of $|v^-|$ goes down from 0.1272 kV to 0.02964 kV.

As a difference with the previous case, the value of $|v^+|$ drops a bit when the FPNSC is enabled. However, this is not due to the injection of negative-sequence currents, but to the cancellation of the injection of positive-sequence active current into the grid at t=500 ms, which was boosting the positive-sequence voltage at the point of connection of the power converter.

Oscillations in the instantaneous active and reactive powers when using the FPNSC strategy with $k_2=0$ are specially relevant, as shown in FIG. 16(d). In this operation mode, as the magnitude of both $v^+$ and $i^-$ are quite high, the oscillations are also important. Nevertheless, this is the price to be paid when using a power strategy focused on balancing the grid voltage at the PCC.

Figure 17:
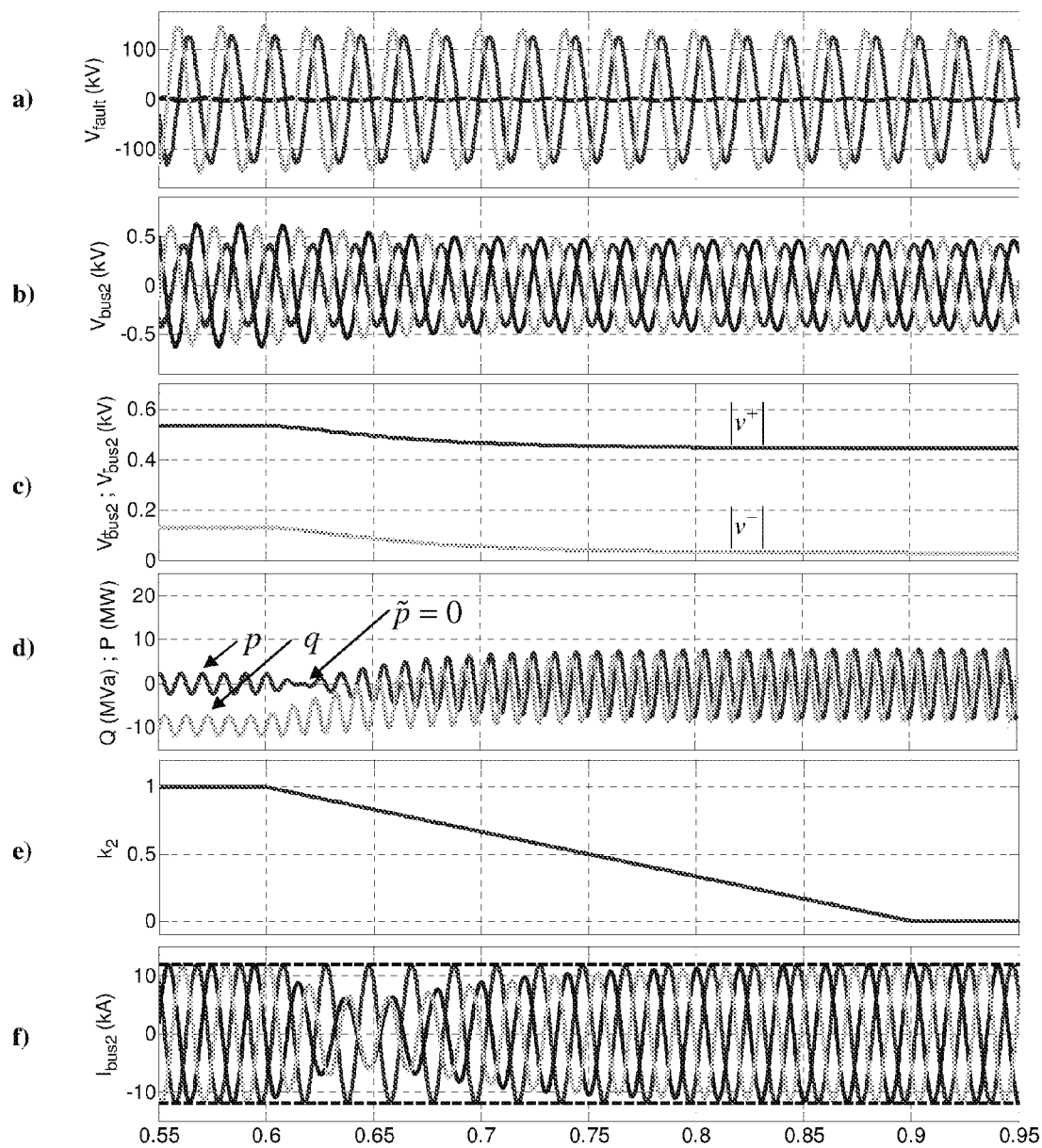
FIG. 17 shows graphical plots of signals measured over time during injection of simultaneous positive and negative sequence reactive power according to an embodiment of the present invention.

In the plot of FIG. 16(e), the current waveforms are displayed, showing again the capability of the FPNSC for limiting the currents injected by the converter below a given limit Case C: Injection of Simultaneous of Positive- and Negative-Sequence Reactive Power
In order to show the performance of the FPNSC strategy when both positive- and negative-sequence reactive currents are injected into the grid, the plots of FIG. 17 show the effect of injecting the maximum amount of reactive power into the grid when the parameter $k_2$ linearly varies from 1 to 0 under unbalanced grid voltage conditions. When the FPNSC strategy is started at t=500 ms, the change in $k_2$ give rise to a linear variation of the symmetrical components of the voltage at the point of connection of the power converter. This can be noticed in the plots of FIG. 17(b) and FIG. 17(c). As it can be concluded from this figure, the higher the value of $k_2$ the better for boosting $|v^+|$, while reducing it contributes to attenuate $|v^-|$.

One interesting feature in this study case to be stressed is the cancellation of the active power oscillation for a certain value of $k_2$. This point, which is highlighted in the plot of FIG. 17(d), can be found as a function of $|v^+|$ and $|v^-|$, as shown in (1.10).

The above described system(s) and method(s) enable the wind turbine to stay connected to the grid during occurrences of asymmetrical and symmetrical grid faults. The above described system(s) and method(s) also prevent overcurrent tripping of the wind turbine at such instances.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for operating a wind turbine comprising a grid side converter, the grid side converter being coupled with an electrical grid, the method comprising:
   determining, based on an operational mode for the wind turbine selected from a plurality of predetermined operational modes, a first active power reference indicating a requested amount of active power and a first reactive power reference indicating a requested amount of reactive power;
   determining, based on the first active power reference, a second active power reference indicating an actual amount of active power to be supplied by the grid side converter to the electrical grid;
   determining, based on the first reactive power reference, a second reactive power reference indicating an actual amount of reactive power to be supplied by the grid side converter to the electrical grid;
   generating, based on the selected operational mode, first and second parameters, wherein the first parameter indicates a first proportion of positive sequence and negative sequence current components to supply the actual amount of active power, and wherein the second parameter indicates a second proportion of positive sequence and negative sequence current components to supply the actual amount of reactive power;
   generating a first current reference based on at least the second active power reference, the second reactive power reference, positive sequence and negative sequence voltages determined from a measured grid voltage, and the first and second parameters; and
   supplying, using the grid side converter, active and reactive power to the electrical grid based on the first current reference.

2. The method of claim 1, further comprising:
   determining, based on the selected operational mode, whether to adjust at least one of the requested amounts of active power and reactive power,
   wherein determining the second active power reference and the second reactive power reference are further based on the determination of whether to adjust at least one of the requested amounts, and
   wherein, when the determination indicates to not adjust the requested amounts, the determined second active power reference equals the first active power reference, and the determined second reactive power reference equals the first reactive power reference.

3. The method of claim 2, wherein determining whether to adjust at least one of the requested amounts comprises:
   determining whether a second current reference calculated using the first active power reference and the first reactive power reference would cause the grid side converter to exceed a predetermined current limit; and
   adjusting, when the second current reference would cause the grid side converter to exceed the predetermined current limit, at least one of the requested amounts such that the first current reference does not cause the grid side converter to exceed the predetermined current limit.

4. The method of claim 2, wherein determining whether to adjust at least one of the requested amount of active power and reactive power comprises:
   determining whether to determine the second active power reference and the second reactive power reference further based on predetermined priority levels indicating whether regulating the active power or regulating the reactive power to corresponding power reference levels has higher priority.

5. The method of claim 3, wherein determining whether the second current reference would cause the grid side converter to exceed the predetermined current limit comprises:
   calculating, for each phase of a plurality of phases of power to be supplied to the electrical grid, a respective maximum current value for the second current reference, the calculation based on at least the selected operation mode, the first active power reference, the first reactive power reference, the positive sequence voltage, the negative sequence voltage, the first parameter, the second parameter, and a determined phase angle,
   wherein the second current reference would cause the grid side converter to exceed the predetermined current limit when at least one of the maximum current values exceeds a predetermined phase current limit.

6. The method of claim 5, wherein calculating the maximum current value for each phase comprises:
   determining an active current ellipse defined by at least the first parameter, the positive sequence voltage, the negative sequence voltage, and the first active power reference,
   determining a reactive current ellipse defined by at least the second parameter, the positive sequence voltage, the negative sequence voltage, a determined in-quadrature positive sequence voltage, a determined in-quadrature negative sequence voltage, and the first reactive power reference,
   producing a combined current ellipse from the active current ellipse and the reactive current ellipse,
   rotating the combined current ellipse about the determined phase angle, and
   determining a plurality of maximum projections of the combined current ellipse onto the abc axes corresponding to a three-phase system, wherein each projection onto the abc axes corresponds to a maximum current value in the respective abc phases of the three-phase system.

7. The method of claim 5, wherein the phase angle is substantially equal to half of a difference between the positive and negative sequence angles of the measured grid voltage.

8. The method of claim 1, further comprising:
   determining at least one of whether the second active power reference is within a predetermined active power range and whether the second reactive power reference is within a predetermined reactive power range, and
   adjusting at least one of the second active power reference and the second reactive power reference such that the second active power reference is within the predetermined active power range and the second reactive power reference is within the predetermined reactive power range.

9. The method of claim 8, further comprising at least one of:
   replacing the second active power reference with:
      an upper limit value of the predetermined active power range when the second active power reference exceeds the upper limit value, and
      a lower limit value of the predetermined active power range when the second active power reference is less than the lower limit value, and
   replacing the second reactive power reference with:
      an upper limit value of the predetermined reactive power range when the second reactive power reference exceeds the upper limit value, and
      a lower limit value of the predetermined reactive power range when the second reactive power reference is less than the lower limit value.

10. The method of claim 1, wherein the second active power reference and the second reactive power reference are determined based on at least the selected operational mode, the first active power reference, the first reactive power reference, the first parameter, the second parameter, the positive sequence voltage, the negative sequence voltage, and a determined phase angle.

11. The method of claim 1, wherein the operational mode is selected based on at least one of the following: a determined type of a grid fault, a determined location of the grid fault, a determined severity of the grid fault, a determined grid support requirement, a determined wind farm support requirement, a determined wind turbine performance factor, and a determined priority of active or reactive power injection.

12. The method of claim 11, wherein the determined wind turbine performance factor corresponds to at least one of:
   reducing a ripple in an output of a machine-side converter of the wind turbine, a DC link voltage, an output of the grid-side converter, reducing a grid voltage unbalance, maximizing the active or the reactive power supplied to the electrical grid, and maintaining stability and support of the wind turbine and the electrical grid.

13. The method of claim 1, wherein values of each of the first parameter and the second parameter are generated in a range between zero and one.

14. The method of claim 1, wherein values of at least one of the first parameter and the second parameter are generated outside the range extending from zero to one.

15. The method of claim 1, wherein the selected operational mode includes a predetermined goal to balance a voltage at a point of common coupling, wherein the grid side converter supplies a predetermined amount of reactive power while a value of the generated second parameter is substantially zero.

16. The method of claim 1, wherein the selected operational mode includes a predetermined goal to boost a voltage at a point of common coupling, wherein the grid side converter supplies a predetermined amount of active power while a value of the generated second parameter is substantially one.

17. The method of claim 1, wherein the selected operational mode includes a predetermined goal to reduce active power oscillations, wherein the grid side converter supplies predetermined amounts of active power and reactive power while a value of the first parameter corresponds to a greatest active power oscillation reduction.

18. The method of claim 1, wherein the current reference and the positive sequence and negative sequence voltages are represented as vector entities.

19. A system for operating a wind turbine comprising a grid side converter and configured to be operatively connected with an electrical grid, the system comprising:
   a wind turbine generator controlling unit configured to, based on an operational mode for the wind turbine selected from a plurality of predetermined operational modes, determine a first active power reference indicating a requested amount of active power and a first reactive power reference indicating a requested amount of reactive power;
   a grid voltage determining unit configured to determine, based on a measured grid voltage, a positive sequence voltage and a negative sequence voltage;
   a power and sequence controlling unit coupled with the wind turbine generator controlling unit and the grid voltage determining unit, the power and sequence controlling unit configured to:
      receive the first active power reference and the first reactive power reference from the wind turbine generator controlling unit;
      determine, based on the first active power reference, a second active power reference indicating an actual amount of active power to be supplied by the grid side converter to the electrical grid;
      determine, based on the first reactive power reference, a second reactive power reference indicating an actual amount of reactive power to be supplied by the grid side converter to the electrical grid; and
      generate, based on at least the selected operational mode, first and second parameters, wherein the first parameter indicates a first proportion of positive sequence and negative sequence current components to supply the actual amount of active power, and wherein the second parameter indicates a second proportion of positive sequence and negative sequence current components to supply the actual amount of reactive power;
   a current reference controlling unit coupled with the power and sequence controlling unit and the grid voltage determining unit, the current reference controlling unit configured to:
      receive the positive sequence voltage and the negative sequence voltage from the grid voltage determining unit;
      receive the second active power reference, the second reactive power reference, the first parameter, and the second parameter from the power and sequence controlling unit;
      generate a first current reference based on at least the second active power reference, the second reactive power reference, the positive sequence voltage, the negative sequence voltage, the first parameter, and the second parameter;
      supplying the first current reference to the grid side converter.

20. The system of claim 19, wherein, in order to determine the second active power reference and the second reactive power reference, the power and sequence controlling unit is further configured to:
- determine, based on the selected operational mode, whether to adjust at least one of the requested amounts of active power and reactive power, wherein determining the second active power reference and the second reactive power reference are further based on the determination of whether to adjust at least one of the requested amounts;
- determine, when the determination indicates to adjust the requested amounts, the second active power reference and the second reactive power reference such that at least one of the second active power reference and the second reactive power reference differs from the respective first active power reference and the first reactive power reference; and
- determine, when the determination indicates to adjust the requested amounts, the second active power reference to equal the first active power reference and the second reactive power reference to equal the first reactive power reference.

21. The system of claim 20, wherein the power and sequence controlling unit is further configured to determine whether to adjust at least one of the requested amounts of active power and reactive power by:
- determining whether a second current reference calculated using the first active power reference and the first reactive power reference would cause the grid side converter to exceed a predetermined current limit, and
- adjusting, when the second current reference would cause the grid side converter to exceed the predetermined current limit, at least one of the requested amounts such that the first current reference does not cause the grid side converter to exceed the predetermined current limit.

22. The system of claim 20, wherein the power and sequence controlling unit is further configured to determine whether to adjust at least one of the requested amounts of active power and reactive power by:
- determining whether to determine the second active power reference and the second reactive power reference further based on predetermined priority levels indicating whether regulating the active power or regulating the reactive power to corresponding power reference levels has higher priority.

23. The system of claim 21, wherein the power and sequence controlling unit is further configured to determine whether the second current reference would cause the grid side converter to exceed the predetermined current limit by:
- calculating, for each phase of a plurality of phases of power to be supplied to the electrical grid, a respective maximum current values for the second current reference, the calculation based on at least the selected operational mode, the first active power reference, the first reactive power reference, the positive sequence voltage, the negative sequence voltage, the first parameter, the second parameter, and a determined phase angle,
- wherein the second current reference would cause the grid side converter to exceed the predetermined current limit when at least one of the maximum current values exceeds a predetermined phase current limit.

24. The system of claim 23, wherein the power and sequence controlling unit is configured to calculate the maximum current value for each phase by:
- determining an active current ellipse defined by at least the first parameter, the positive sequence voltage, the negative sequence voltage, and the first active power reference,
- determining a reactive current ellipse defined by at least the second parameter, the positive sequence voltage, the negative sequence voltage, a determined in-quadrature positive sequence voltage, a determined in-quadrature negative sequence voltage, and the first reactive power reference,
- producing a combined current ellipse from the active current ellipse and the reactive current ellipse,
- rotating the combined current ellipse about the determined phase angle, and
- determining a plurality of maximum projections of the combined current ellipse onto the abc axes corresponding to a three-phase system, wherein each projection onto the abc axes corresponds to a maximum current value in the respective abc phases of the three-phase system.

25. The system of claim 19, wherein the power and sequence controlling unit is further configured to:
- determine at least one of whether the second active power reference is within a predetermined active power range and whether the second reactive power reference is within a predetermined reactive power range, and
- adjust at least one of the second active power reference and the second reactive power reference such that the second active power reference is within the predetermined active power range and the second reactive power reference is within the predetermined reactive power range.

26. The system of claim 25, wherein the power and sequence controlling unit is further configured to:
- replace the second active power reference with:
  - an upper limit value of the predetermined active power range when the second active power reference exceeds the upper limit value, and
  - a lower limit value of the predetermined active power range when the second active power reference is less than the lower limit value, and
- replace the second reactive power reference with:
  - an upper limit value of the predetermined reactive power range when the second reactive power reference exceeds the upper limit value, and
  - a lower limit value of the predetermined reactive power range when the second reactive power reference is less than the lower limit value.

* * * * *